US011545472B2

(12) United States Patent
Guo et al.

(10) Patent No.: US 11,545,472 B2
(45) Date of Patent: Jan. 3, 2023

(54) BI-DIRECTIONAL OPTICAL MODULE AND TRANSPARENT DISPLAY APPARATUS USING THE SAME

(71) Applicant: AU OPTRONICS CORPORATION, Hsin-chu (TW)

(72) Inventors: Ting-Wei Guo, Hsin-Chu (TW); Chen-Chi Lin, Hsin-Chu (TW); Pin-Miao Liu, Hsin-chu (TW); Cheng-Chieh Chang, Hsin-chu (TW); Ho-Cheng Lee, Hsin-chu (TW); Wen-Wei Yang, Hsin-chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 324 days.

(21) Appl. No.: 16/784,646

(22) Filed: Feb. 7, 2020

(65) Prior Publication Data
US 2020/0176425 A1 Jun. 4, 2020

Related U.S. Application Data

(62) Division of application No. 15/981,098, filed on May 16, 2018, now abandoned.

(30) Foreign Application Priority Data

Aug. 4, 2017 (TW) .................................. 106126436

(51) Int. Cl.
H01L 33/38 (2010.01)
H01L 25/075 (2006.01)
(Continued)

(52) U.S. Cl.
CPC ....... *H01L 25/0753* (2013.01); *G09G 3/3233* (2013.01); *H01L 25/165* (2013.01);
(Continued)

(58) Field of Classification Search
CPC ... H01L 25/165; H01L 33/58; H01L 25/0753; H01L 33/60; H01L 33/38; H01L 27/3218;
(Continued)

(56) References Cited

U.S. PATENT DOCUMENTS

2005/0151830 A1* 7/2005 Yamazaki ................ G09G 3/20
347/238
2010/0148202 A1* 6/2010 Tomoda ................... H01L 33/44
257/E33.068

(Continued)

*Primary Examiner* — Matthew C Landau
*Assistant Examiner* — Dmitriy Yemelyanov
(74) *Attorney, Agent, or Firm* — Tim Tingkang Xia, Esq.; Locke Lord LLP

(57) ABSTRACT

A bi-directional optical module includes a substrate, at least one first light-emitting diode (LED), and at least one second LED. The first LED is disposed on a surface of the substrate. The first LED has a first reflection surface and a first light-outlet surface that are opposite to each other, and the first light-outlet surface is away from the substrate relative to the first reflection surface. The second LED is disposed on the same surface of the substrate. The second LED has a second reflection surface and a second light-outlet surface that are opposite to each other, and the second light-outlet surface is close to the substrate relative to the second reflection surface. The substrate has at least one light-transparent area that is not occupied by the first LED and the second LED.

16 Claims, 17 Drawing Sheets

(51) Int. Cl.
*H01L 33/60* (2010.01)
*H01L 33/62* (2010.01)
*H01L 25/16* (2006.01)
*H01L 33/58* (2010.01)
*H01L 27/32* (2006.01)
*G09G 3/3233* (2016.01)
*G09G 3/32* (2016.01)
*H01L 33/42* (2010.01)
*H01L 33/46* (2010.01)
*H01L 33/40* (2010.01)
*H01L 51/52* (2006.01)

(52) U.S. Cl.
CPC ............ *H01L 27/32* (2013.01); *H01L 27/326* (2013.01); *H01L 27/3218* (2013.01); *H01L 33/38* (2013.01); *H01L 33/58* (2013.01); *H01L 33/60* (2013.01); *H01L 33/62* (2013.01); *G09G 3/32* (2013.01); *G09G 2300/0452* (2013.01); *G09G 2300/0861* (2013.01); *G09G 2310/0251* (2013.01); *G09G 2310/0262* (2013.01); *H01L 25/167* (2013.01); *H01L 33/405* (2013.01); *H01L 33/42* (2013.01); *H01L 33/46* (2013.01); *H01L 51/5275* (2013.01); *H01L 2251/5323* (2013.01)

(58) Field of Classification Search
CPC ....... H01L 27/326; H01L 27/32; H01L 33/62; H01L 25/167; H01L 51/5275; H01L 2251/5323; H01L 33/405; H01L 33/42; H01L 33/46; G09G 3/3233; G09G 3/32; G09G 2310/0262; G09G 2300/0452; G09G 2300/0861; G09G 2310/0251
See application file for complete search history.

(56) References Cited

U.S. PATENT DOCUMENTS

| | | | |
|---|---|---|---|
| 2014/0077725 A1* | 3/2014 | Lee | G09G 3/3225 |
| | | | 315/312 |
| 2014/0209945 A1* | 7/2014 | Baldridge | H01L 25/0753 |
| | | | 257/91 |
| 2016/0190393 A1* | 6/2016 | Ito | H01L 33/405 |
| | | | 257/98 |

* cited by examiner

BI-DIRECTIONAL OPTICAL MODULE AND TRANSPARENT DISPLAY APPARATUS USING THE SAME

CROSS-REFERENCE TO RELATED PATENT APPLICATION

This application is a divisional application of U.S. patent application Ser. No. 15/981,098, filed on May 16, 2018, which itself claims priority to and the benefit of, pursuant to 35 U.S.C. § 119(a), patent application Serial No. 106126436 filed in Taiwan on Aug. 4, 2017. The disclosures of the above applications are incorporated herein in their entireties by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present disclosure relates to a bi-directional optical module and a transparent display apparatus using the same.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

In recent years, with the vigorous development of display technologies, increasing importance is also attached to transparent display apparatuses. Generally, a transparent display apparatus can provide a user with a displayed image, and the user can perspectively view, through the transparent display apparatus, a displayed article or a sight that is behind the transparent display apparatus. That is, in addition to an original display function, the transparent display apparatus also has a feature of displaying the background of the picture, and may be widely applied to a large-scale commercial exhibition, a shop window, or a display window of a commodity showcase, to both display an advertisement image and display a commodity. In tradition, a transparent display apparatus includes a liquid panel and a backlight module (such as a light box), and the backlight module may be disposed behind or on a side of the liquid panel, to provide the liquid panel with a light source. However, some light of the backlight module is also emitted to a displayed article that is behind the transparent display panel, causing distortion of the colored light, color temperature, or tone of the displayed article, thereby reducing the viewing quality of the displayed article.

SUMMARY

The present disclosure provides a bi-directional optical module and a transparent display apparatus that uses the bi-directional optical module. The bi-directional optical module can improve viewing quality of a displayed article that is behind the transparent display apparatus, and can increase penetration of the transparent display apparatus.

According to some implementations of the present disclosure, the bi-directional optical module includes a substrate, at least one first light-emitting diode (LED), and at least one second LED. The first LED is disposed on a surface of the substrate. The first LED has a first reflection surface and a first light-outlet surface that are opposite to each other, and the first light-outlet surface is away from the substrate relative to the first reflection surface. The second LED is disposed on the same surface of the substrate. The second LED has a second reflection surface and a second light-outlet surface that are opposite to each other, and the second light-outlet surface is close to the substrate relative to the second reflection surface. The substrate has at least one light-transparent area that is not occupied by the first LED and the second LED.

According to some implementations of the present disclosure, the transparent display apparatus includes the bi-directional optical module, at least one pixel circuit, and at least one second switch transistor. The pixel circuit is electrically coupled to the first LED of the bi-directional optical module. The pixel circuit includes a first switch transistor, and the first switch transistor has a first gate electrode. The second switch transistor is electrically coupled to the second LED of the bi-directional optical module. The second switch transistor includes a second gate electrode, and the second gate electrode of the second switch transistor and the first gate electrode of the first switch transistor are electrically coupled to a same control signal source.

These and other aspects of the present disclosure will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

Multiple modes of the present disclosure may be understood by reading the following detailed descriptions with reference to the corresponding drawings. It should be noted that, multiple features in the drawings are not drawn to actual scale according to standards in the industry. Actually, sizes of the features may be randomly increased or decreased, to facilitate clarity of discussion.

DETAILED DESCRIPTION

The following clearly describes the spirit of the present disclosure by using figures and detailed descriptions. After an embodiment of the present disclosure is understood, any variations and modifications made by a person of ordinary skill in the art by using the technologies learned from the present disclosure fall within the spirit and scope of the present disclosure.

Figure 1:
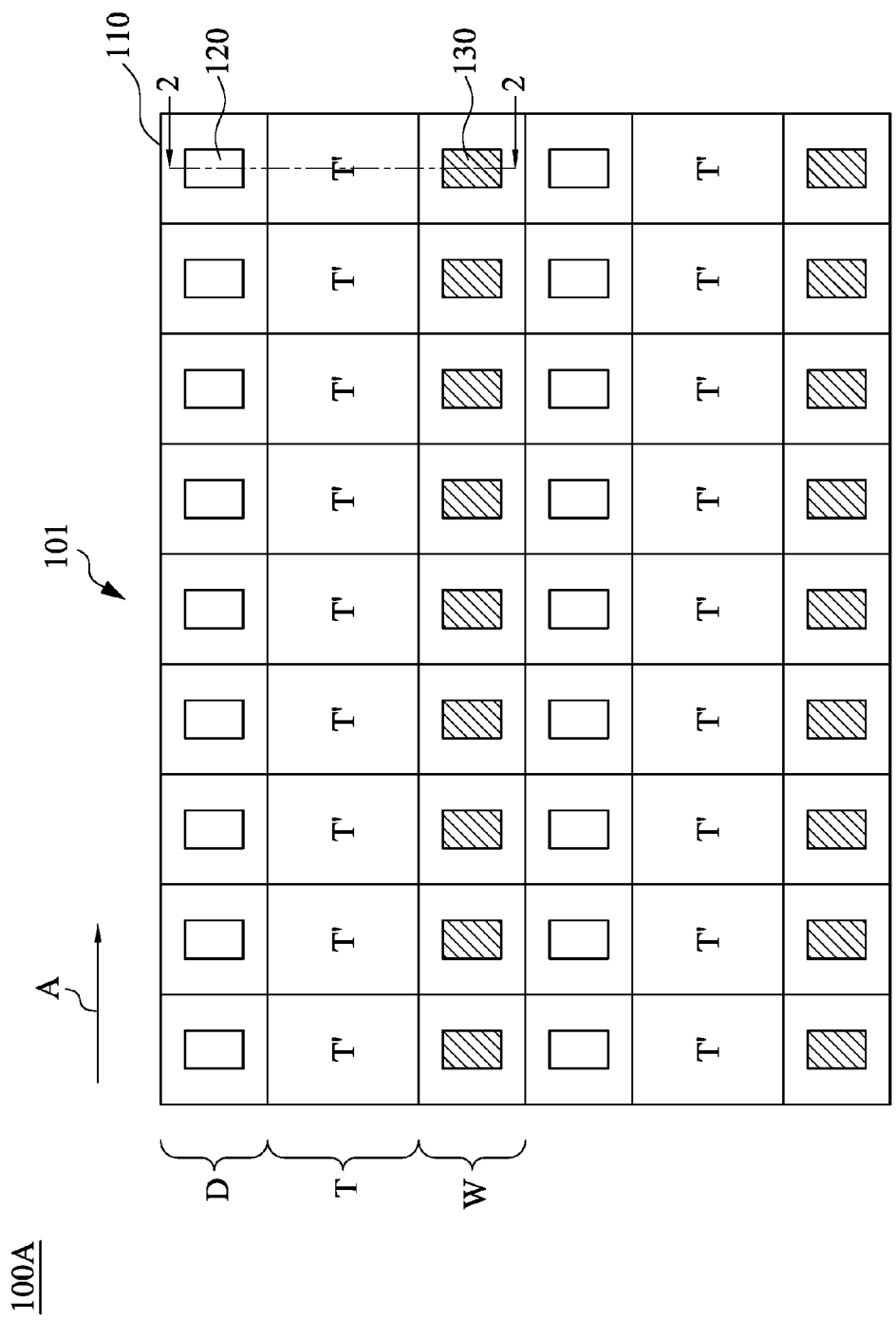
FIG. 1 is a schematic top view of a bi-directional optical module according to some implementations of the present disclosure.

Referring to FIG. 1, FIG. 1 is a schematic top view of a transparent display apparatus 100A according to some implementations of the present disclosure. The transparent display apparatus 100A includes a bi-directional optical module 101. The transparent display apparatus 100A can use the bi-directional optical module 101 to achieve an effect of simultaneously displaying an image and presenting a commodity. The presenting a commodity refers to spotlighting the commodity, so that the commodity can gain attention. The bi-directional optical module 101A includes a substrate 110, a first LED 120, and a second LED 130. The substrate 110 has a display area D, a lighting area W, and a light-transparent area T. Specifically, the substrate 110 has the display area D occupied by the first LED 120, the lighting area W occupied by the second LED 130, and the light-transparent area T not occupied by the first LED 120 and the second LED 130. The light-transparent area T may be formed by multiple light-transparent portions T'. In addition, the display area D, the light-transparent area T, and the lighting area W may be sequentially arranged or randomly arranged on the substrate 110. The substrate 110 may be a transparent substrate, a rigid substrate, or a flexible substrate, such as glass, tempered glass, polycarbonate (PC), polyethylene terephthalate (PET), or other cyclic olefin copolymer. However, the present disclosure is not limited to this.

The first LED 120 may be a plurality of first LEDs 120, the second LED 130 may be a plurality of second LEDs 130, and the light-transparent area T may also be a plurality of light-transparent areas T. In addition, the first LEDs 120 and the second LEDs 130 may form multiple types of sub-pixel areas in different arrangement manners and to different scales. For example, in the configuration manner shown in FIG. 1, the first LEDs 120 are arranged in multiple rows in a configuration direction A, and the second LEDs 130 are also arranged in multiple rows in the configuration direction A. The first LEDs 120 and the second LEDs 130 that are in some rows may be separated by the light-transparent area T. That is, the first LEDs 120 and the second LEDs 130 that are in the some rows are disposed on two opposite sides of the light-transparent area T.

Figure 2:
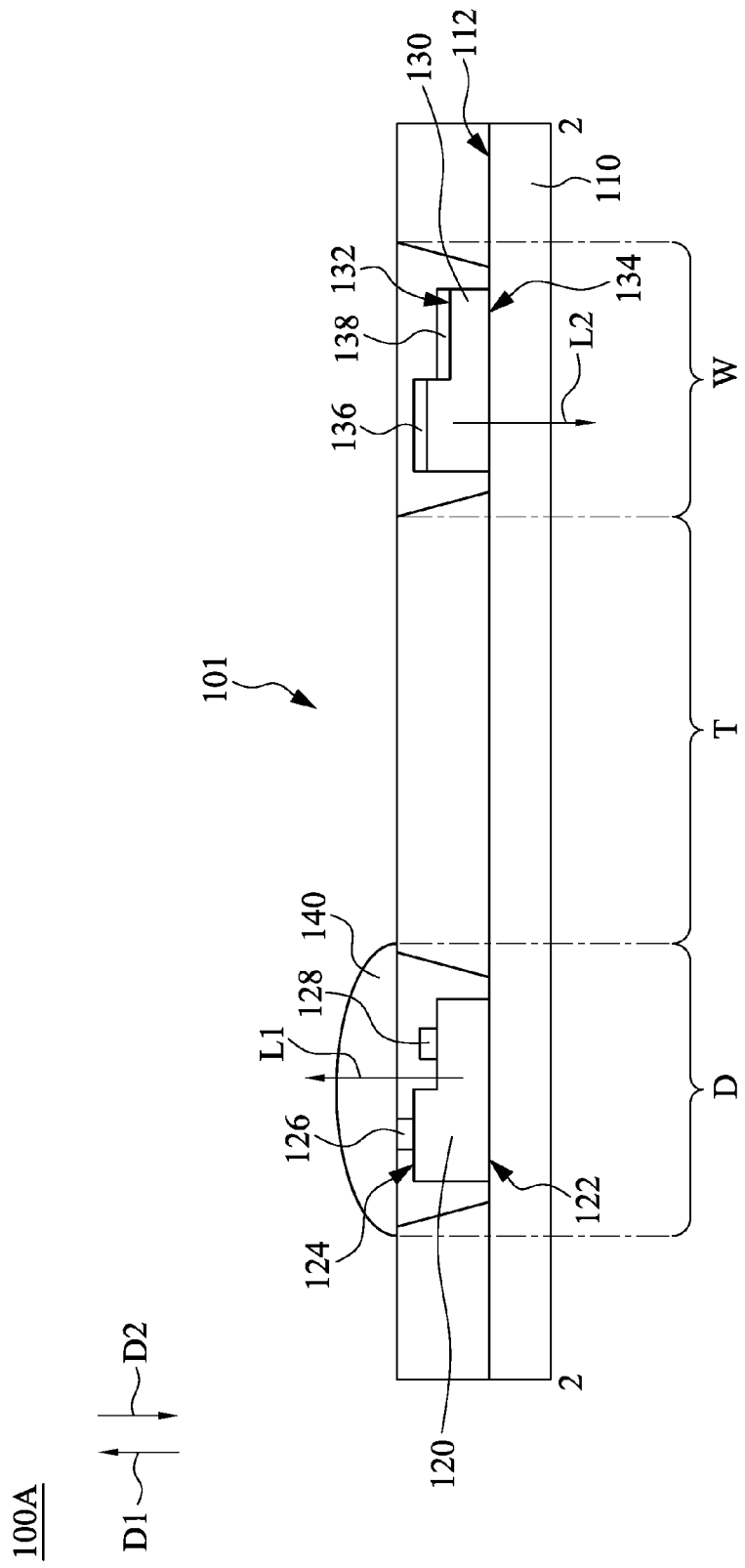
FIG. 2 is a schematic sectional view along a line segment 2-2 of FIG. 1.

Referring to FIG. 2, FIG. 2 is a schematic sectional view along a line segment 2-2 of FIG. 1. The first LED 120 is located in the display area D of the substrate 110, and is disposed on an upper surface 112 of the substrate 110. The first LED 120 has a first reflection surface 122 and a first light-outlet surface 124 that are opposite to each other, and the first light-outlet surface 124 is away from the substrate 110 relative to the first reflection surface 122.

The first LED 120 may be configured to emit a first light beam L1. The first light beam L1 may roughly travel in a first direction D1, and the first direction D1 is a direction in which the first reflection surface 122 and the first light-outlet surface 124 are arranged. In addition, if the first LED 120 generates a light beam that travels in a direction different from the first direction D1, and when the light beam arrives at the first reflection surface 122 of the first LED 120, the light beam may be reflected by the first reflection surface 122 and change direction, the light beam may travel in the first direction D1 and penetrate the first light-outlet surface 124 to leave the first LED 120. That is, when the first LED 120 generates a light beam that travels towards the first reflection surface 122, the light beam does not penetrate the first reflection surface 122, and the light beam finally leaves the first LED 120 in a manner of traveling in the first direction D1.

The second LED 130 is located in the lighting area W of the substrate 110, and is disposed on the upper surface 112 of the substrate 110. The second LED 130 has a second reflection surface 132 and a second light-outlet surface 134 that are opposite to each other, and the second light-outlet surface 134 is close to the substrate 110 relative to the second reflection surface 132.

The second LED 130 may be configured to emit a second light beam L2. The second light beam L2 may roughly travel in a second direction D2. The second direction D2 is a direction in which the second reflection surface 132 and the second light-outlet surface 134 are arranged, and the first direction D1 and the second direction D2 may be a pair of directions opposite to each other. Similarly, when the second LED 130 generates a light beam that travels in a direction different from the second direction D2, and when the light beam arrives at the second reflection surface 132 of the second LED 130, the light beam may be reflected by the second reflection surface 132 and change direction, the light beam may travel in the second direction D2 and penetrate the second light-outlet surface 134 to leave the second LED 130. That is, when the second LED 130 generates a light beam that travels towards the second reflection surface 132, the light beam generally does not penetrate the second reflection surface 132, and the light beam finally leaves the second LED 130 in a manner of traveling in the second direction D2.

By means of the foregoing configuration, the first light beam L1 emitted by the first LED 120 may leave the first LED 120 in the first direction D1, and the second light beam L2 emitted by the second LED 130 may leave the second LED 130 in the second direction D2. However, the first direction D1 and the second direction D2 are opposite to each other, and therefore the transparent display apparatus 100A may use the bi-directional optical module 101A to implement bi-directional light emission.

In addition, the first LED 120 may include a first anode structure 126 and a first cathode structure 128. The first anode structure 126 is disposed on the first light-outlet surface 124 of the first LED 120, and there is a first anode contact area between the first anode structure 126 and the first light-outlet surface 124 of the first LED 120. The first cathode structure 128 is disposed on the first light-outlet surface 124 of the first LED 120, and there is a first cathode contact area between the first cathode structure 128 and the first light-outlet surface 124 of the first LED 120. A sum of the first anode contact area and the first cathode contact area is less than an area of the first light-outlet surface 124 of the first LED 120. More specifically, the first anode structure 126 and the first cathode structure 128 are disposed in a local area of the first light-outlet surface 124 of the first LED 120, and the first anode structure 126 and the first cathode structure 128 are separated and spaced apart from each other by at least a distance.

By means of this configuration, the first light beam L1 emitted by the first LED 120 is not completely blocked by the first anode structure 126 and the first cathode structure 128, and therefore can penetrate at least one part of the first light-outlet surface 124, thereby increasing light-outlet efficiency of the first LED 120. In some implementations, the first anode structure 126 and the first cathode structure 128 may include silver, aluminum, gold, tungsten, copper, or other proper metal materials. However, the present disclosure is not limited to this. The first anode structure 126 and the first cathode structure 128 that are described in the present disclosure merely represent that the two are respectively electrically coupled to different power supply sources, but do not represent essential positive and negative poles of an LED. That is, for a current that flows through the first LED 120, in some implementations, the current may flow from the first anode structure 126 to the first cathode structure 128; or in some other implementations, the current may flow from the first cathode structure 128 to the first anode structure 126.

On the other hand, the second LED 130 may also include a second anode structure 136 and a second cathode structure 138. The second anode structure 136 is disposed on the second reflection surface 132 of the second LED 130, and there is a second anode contact area between the second anode structure 136 and the second reflection surface 132 of the second LED 130. The second cathode structure 138 is disposed on the second reflection surface 132 of the second LED 130, and there is a second cathode contact area between the second cathode structure 138 and the second reflection surface 132 of the second LED 130. A sum of the second anode contact area and the second cathode contact area is essentially roughly equal to an area of the second reflection surface 132 of the second LED 130. More specifically, the second anode structure 136 and the second cathode structure 138 may almost completely occupy the second reflection surface 132 of the second LED 130, thereby reducing a probability that a light beam emitted by the second LED 130 penetrates the second reflection surface 132. In some implementations, the second anode structure 136 and the second cathode structure 138 may include silver, aluminum, gold, tungsten, copper, or other proper metal materials. However, the present disclosure is not limited to this.

In some implementations, the first LED 120 may be a solid light source, such as a red light source, a green light source, or a blue light source, and may be an organic LED. Multiple first LEDs 120 may form a solid light source array. However, the present disclosure is not limited to this. In another implementation, the first LED 120 may alternatively be a micro-LED, and form a pixel array. In addition, the size of the micro-LED device may be adjusted according to a requirement on a pixel size of a display apparatus.

In some implementations, the second LED 130 may include a red light source, a green light source, or a blue light source, and may be a LED or an organic LED. However, the present disclosure is not limited to this. In some implementations, the second LED 130 may include at least one red light source, at least one green light source, and at least one blue light source, so as to generate white light by means of mixture. Alternatively, the second LED 130 may be a white LED, such as a white micro-LED. However, the present disclosure is not limited to this.

The first reflection surface 122 of the first LED 120 may include a thin metal film, or a reflective film made of another high reflectivity material, so as to more effectively deflect, to the first light-outlet surface 124, an emitted light beam that travels in a direction different from the first direction D1. However, the present disclosure is not limited to this. Similarly, in some implementations, the second reflection surface 132 may include a thin metal film, or a reflective film made of another high reflectivity material, so as to more effectively deflect, to the second light-outlet surface 134, a light beam that travels in a direction different from the second direction D2. However, the present disclosure is not limited to this.

In addition, the bi-directional optical module 101 may further include a light guiding structure 140. The light guiding structure 140 is disposed on the first light-outlet surface 124 of the first LED 120, so as to increase directionality that is of the first light beam L1 emitted by the first LED 120 and that is for directing the first direction D1. In some implementations, the light guiding structure 140 may include a plastic material. A refractive index of the plastic material may be between that of the first LED 120 and that of the air, thereby preventing the first light beam L1 from large-angle deflection when the first light beam L1 leaves the first LED 120. In some implementations, the light guiding structure 140 may include a plastic material and a micro-lens. The plastic material may be disposed between the micro-lens and the first LED 120. However, the present disclosure is not limited to this.

Figure 3:
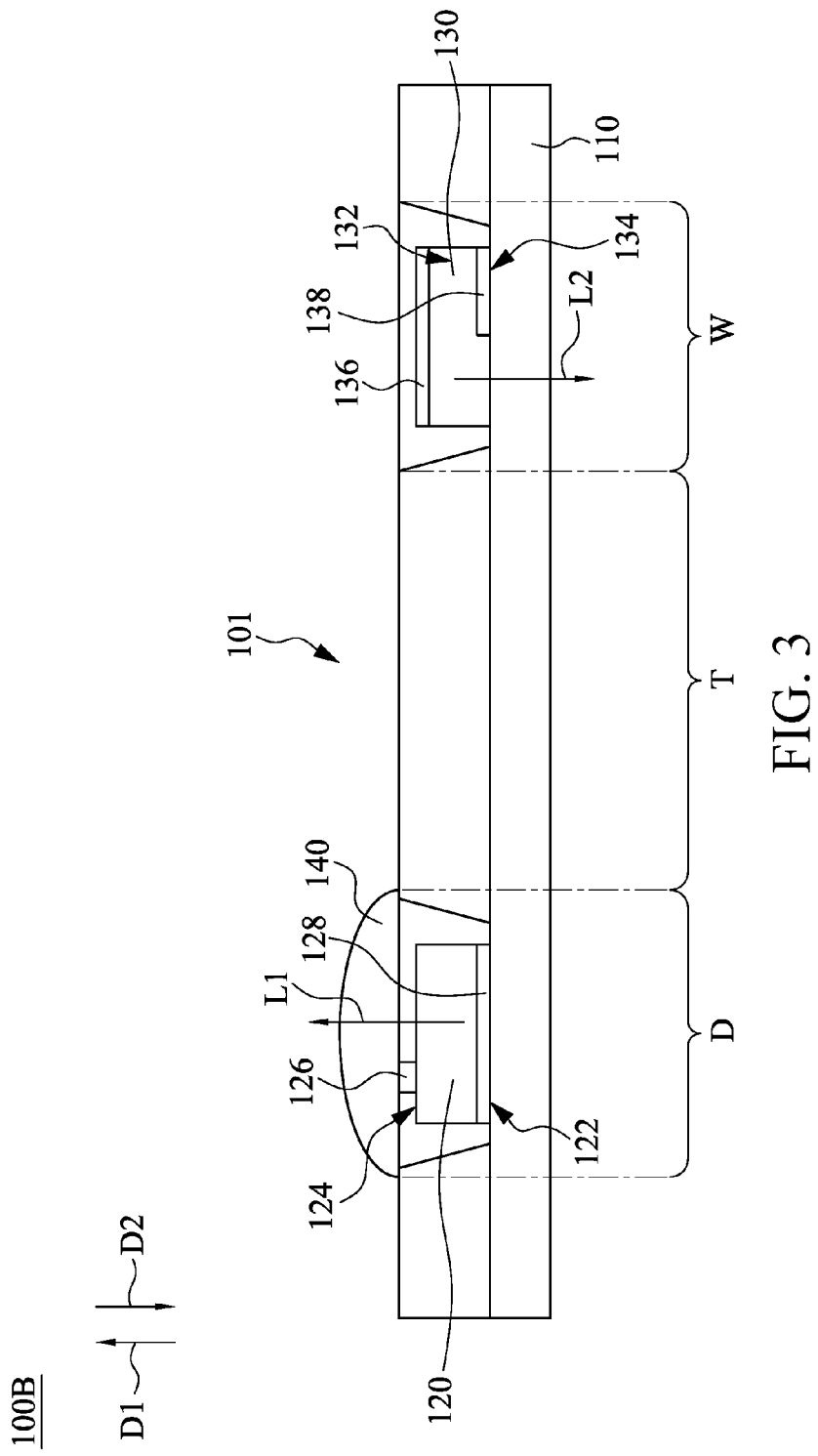
FIG. 3 is a schematic sectional view of a bi-directional optical module according to some implementations of the present disclosure.

Referring to FIG. 3, FIG. 3 is a schematic sectional view of a transparent display apparatus 100B according to some implementations of the present disclosure. A location of the cross-section drawn in FIG. 3 is the same as that in FIG. 2. At least one difference between the transparent display apparatus 100B drawn in FIG. 3 and the transparent display apparatus 100A drawn in FIG. 2 lies in that, in the transparent display apparatus 100B drawn in FIG. 3, the first anode structure 126 and the first cathode structure 128 that are of the first LED 120 are respectively disposed on two opposite surfaces of the first LED 120, and the second anode structure 136 and the second cathode structure 138 that are of the second LED 130 are similarly respectively disposed on two opposite surfaces of the second LED.

Specifically, the first anode structure 126 is disposed on the first light-outlet surface 124, and the first cathode structure 128 is disposed on the first reflection surface 122. There is a first anode contact area between the first anode structure 126 and the first light-outlet surface 124, and there is a first cathode contact area between the first cathode structure 128 and the first reflection surface 122. The first anode contact area is smaller than the first cathode contact area. The first cathode contact area of the first reflection surface 122 is relatively larger than the first anode contact area of the first light-outlet surface 124. Therefore, the first light beam L1 emitted by the first LED 120 is more easily blocked by the first cathode structure 128, and the first light beam L1 is more easily kept away from the first anode structure 126, so that the first light beam L1 can penetrate the first light-outlet surface 124 more easily to leave the first LED 120, helping increase light-outlet efficiency of the first LED 120.

The second anode structure 136 is disposed on the second reflection surface 132, and the second cathode structure 138 is disposed on the second light-outlet surface 134. There is a second anode contact area between the second anode structure 136 and the second reflection surface 132, and there is a second cathode contact area between the second cathode structure 138 and the second light-outlet surface 134. The second anode contact area is larger than the second cathode area. By means of this configuration, when the second LED 130 generates a light beam that travels in a direction different from the second direction D2, and when the light beam arrives at the second reflection surface 132 of the second LED 130, the light beam may be blocked by the second anode structure 136 and therefore less easily penetrate the second reflection surface 132, helping increase light-outlet efficiency of the second LED 130.

Figure 4:
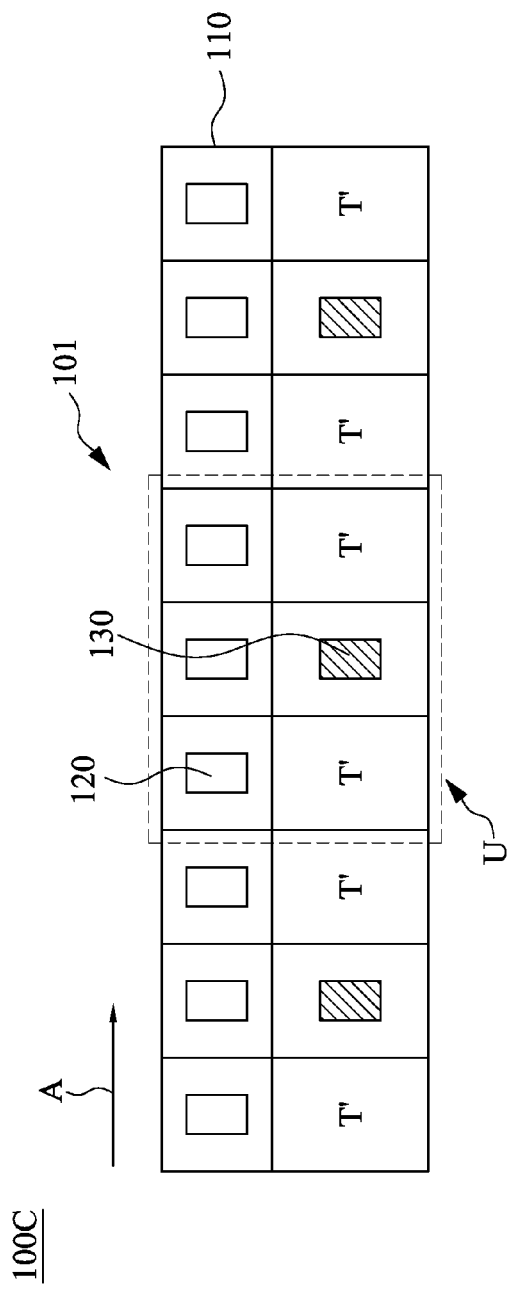
FIG. 4 is a schematic top view of a bi-directional optical module according to some implementations of the present disclosure.
Figure 5:
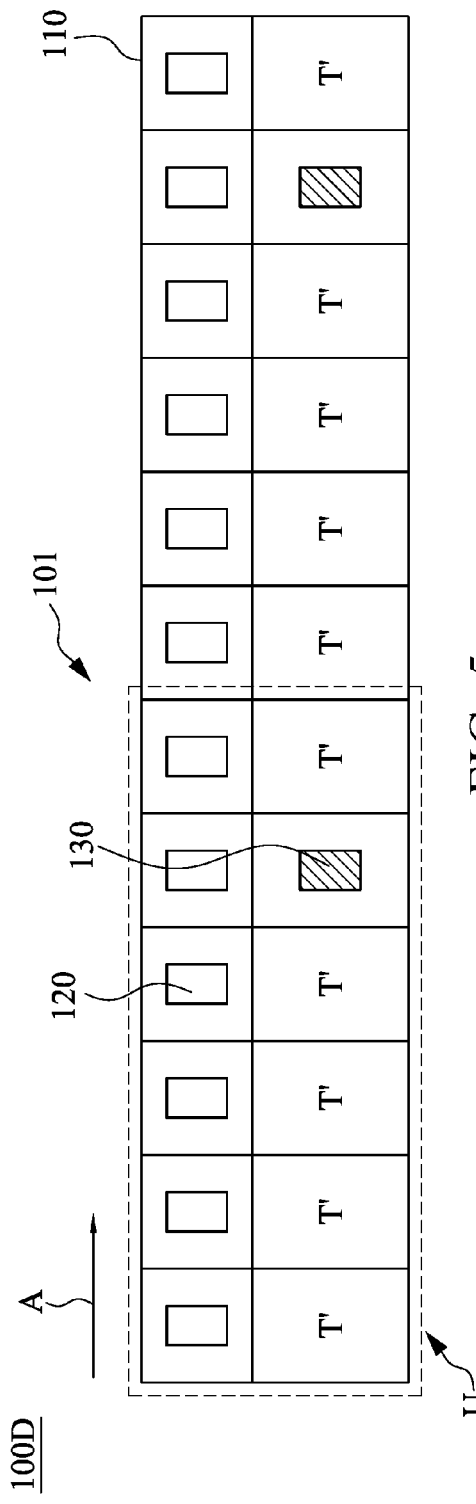
FIG. 5 is a schematic top view of a bi-directional optical module according to some implementations of the present disclosure.

Referring to both FIG. 4 and FIG. 5, FIG. 4 and FIG. 5 are schematic top views of transparent display apparatuses 100C and 100D according to some implementations of the present disclosure. At least one difference between the transparent display apparatuses 100C and 100D drawn in FIG. 4 and FIG. 5 and the transparent display apparatus 100A drawn in FIG. 1 lies in that, in the transparent display apparatuses 100C and 100D drawn in FIG. 4 and FIG. 5, the first LEDs 120 of the bi-directional optical module 101 may be arranged in the configuration direction A, but the second LEDs 130 of the bi-directional optical module 101 and the light-transparent portions T' are alternately arranged in the configuration direction A. A horizontal row formed by the first LEDs 120 and a horizontal row formed by the second LEDs 130 and the light-transparent portions T' are mutually side by side. In addition, in the transparent display apparatuses 100C and 100D drawn in FIG. 4 and FIG. 5, a proportion in which the light-transparent portions T' of the bi-directional optical module 101 occupies the substrate 110 may be adjusted according to a penetration requirement of the applied transparent display apparatus, thereby increasing diversity of penetration of the transparent display apparatus.

For example, as shown in FIG. 4, the bi-directional optical module 101 may be formed by repetitively arranging a unit area U. The unit area U is formed by three first LEDs 120, two second LEDs 130, and one light-transparent portion T'. In the unit area U, the three first LEDs 120 are jointly arranged in a row in the configuration direction A, the two second LEDs 130 and one light-transparent portion T' are jointly arranged in a row in the configuration direction A, and the light-transparent portion T' is located between the two second LEDs 130.

Alternatively, as shown in FIG. 5, the unit area U that forms the bi-directional optical module 101 may be formed by six first LEDs 120, one second LED 130, and five light-transparent portions T'. In the unit area U, the six first LEDs 120 are jointly arranged in a row in the configuration direction A, and the one second LED 130 and the five light-transparent portions T' are jointly arranged in a row in the configuration direction A. After four light-transparent portions T' are consecutively arranged, the second LED 130 is inserted, and then one light-transparent portion T' is arranged, that is, four light-transparent portions T' and one light-transparent portion T' are disposed on both the left side and the right side of the second LED 130.

Figure 6:
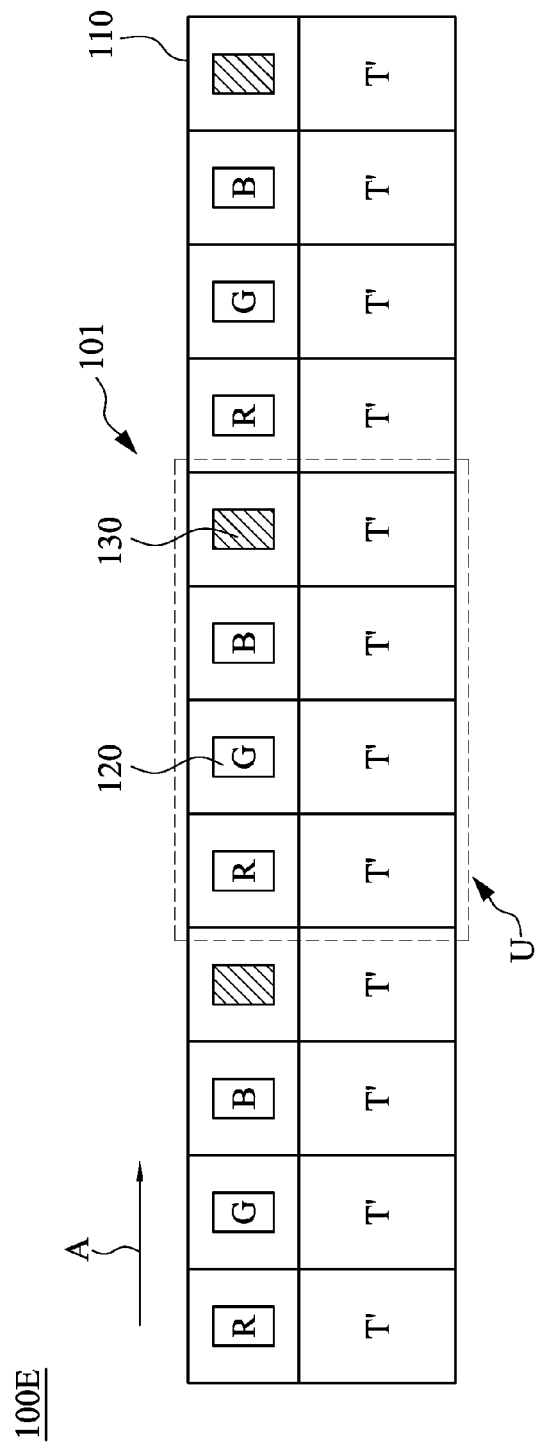
FIG. 6 is a schematic top view of a bi-directional optical module according to some implementations of the present disclosure.

Referring to FIG. 6, FIG. 6 is a schematic top view of a transparent display apparatus 100E according to some implementations of the present disclosure. At least one difference between the transparent display apparatus 100E drawn in FIG. 6 and the foregoing transparent display apparatus lies in that, in the transparent display apparatus 100E drawn in FIG. 6, the first LED 120 of the bi-directional optical module 101 may be classified into a red LED R, a green LED G, and a blue LED B, and the unit area U that forms the bi-directional optical module 101 may be formed by the red LED R, the green LED G, the blue LED B, the second LED 130, and the four light-transparent portions T'. In the unit area U, the red LED R, the green LED G, the blue LED B, and the second LED 130 are sequentially arranged in a row in the configuration direction A, and the four light-transparent portions T' are jointly arranged in a row in the configuration direction A. By means of this configuration, an area of the light-transparent portion T' may be larger than an area of a display area (including areas of the red LED R, the green LED G, and the blue LED B), and also larger than an area of the lighting area (including an area of the second LED 130), helping increase penetration of the applied transparent display apparatus.

Figure 7:
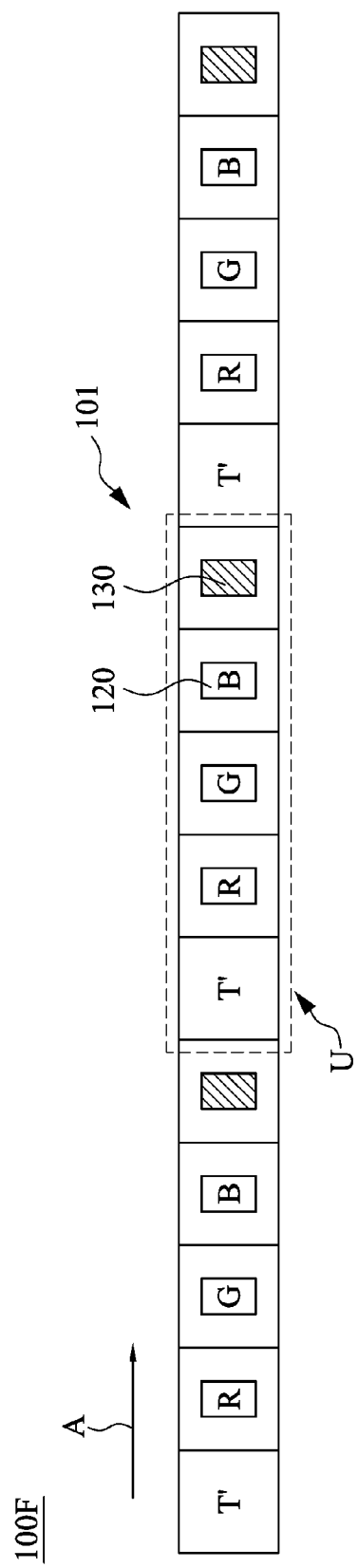
FIG. 7 is a schematic top view of a bi-directional optical module according to some implementations of the present disclosure.
Figure 8:
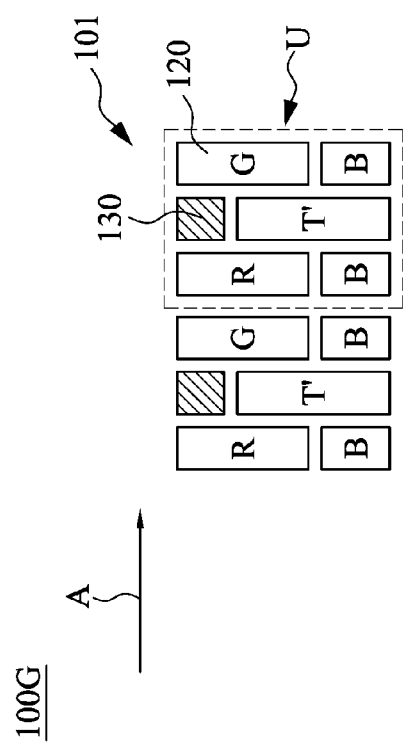
FIG. 8 is a schematic top view of a bi-directional optical module according to some implementations of the present disclosure.

Referring to both FIG. 7 and FIG. 8, FIG. 7 and FIG. 8 are respectively schematic top views of transparent display apparatuses 100F and 100G according to some implementations of the present disclosure. At least one difference between the transparent display apparatuses 100F and 100G drawn in FIG. 7 and FIG. 8 and the foregoing transparent display apparatus lies in that, in the transparent display apparatuses 100F and 100G drawn in FIG. 7 and FIG. 8, the first LED 120 of the bi-directional optical module 101 may be classified into a red LED R, a green LED G, and a blue LED B, and the first LED 120, the second LED 130, and the light-transparent portion T' are arranged in an staggered manner, helping increase a resolution of the applied transparent display apparatus.

For example, as shown in FIG. 7, the unit area U that forms the bi-directional optical module 101 may be formed by arranging the light-transparent portion T', the red LED R, the green LED G, the blue LED B, and the second LED 130 in a row in the configuration direction A.

Alternatively, as shown in FIG. 8, the unit area U that forms the bi-directional optical module 101 may be formed by arranging the red LED R, the green LED G, the blue LED B, the second LED 130, and the light-transparent portion T' in a staggered manner. Specifically, the red LED R and the green LED G may be arranged in the configuration direction A, the blue LED B and the red LED R (or the green LED G)

may be arranged perpendicular to the configuration direction A, and the red LED R and the green LED G may be separated by the second LED 130 and the light-transparent portion T'.

Figure 9:
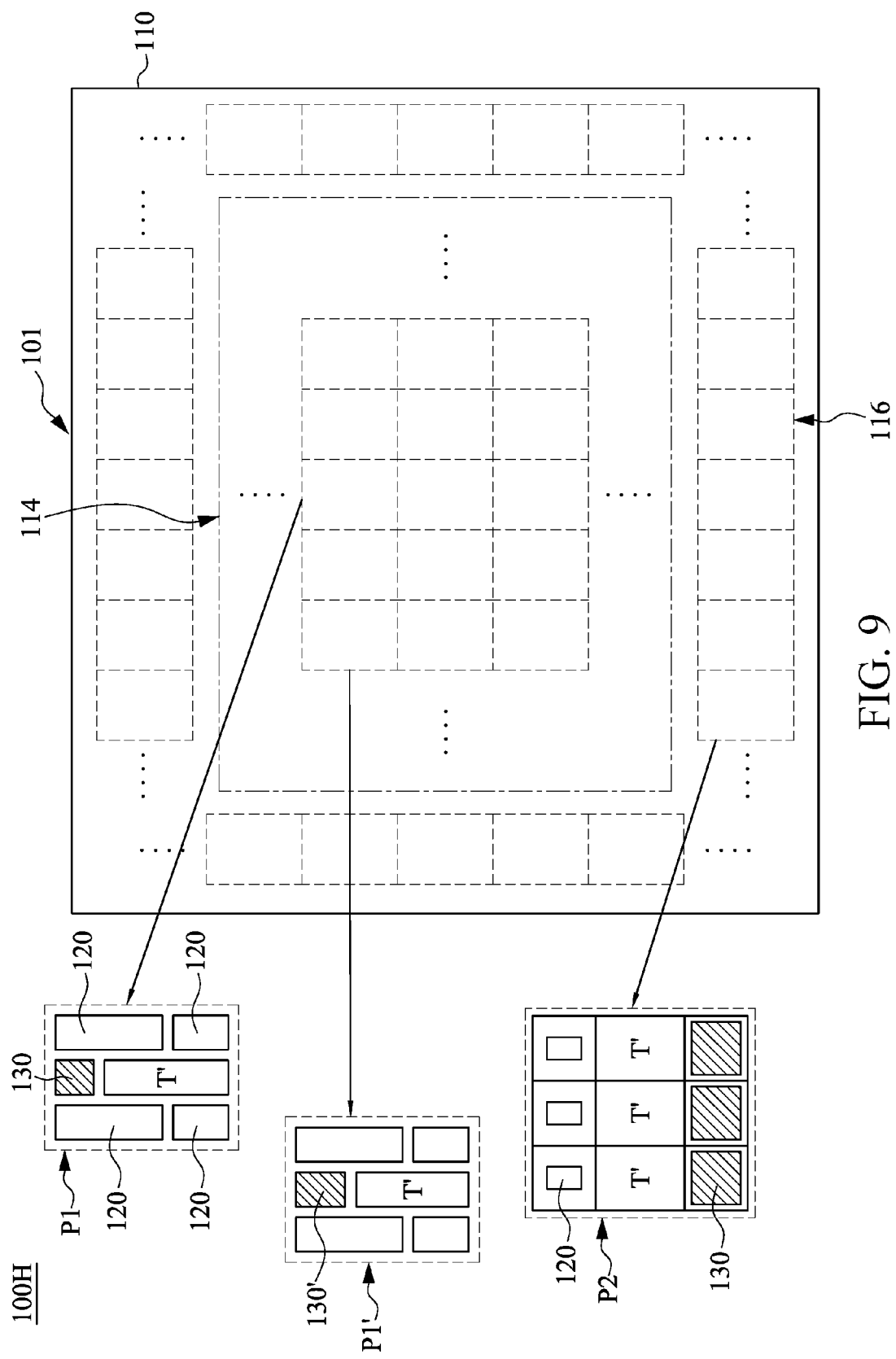
FIG. 9 is a schematic top view of a bi-directional optical module according to some implementations of the present disclosure.

Referring to FIG. 9, FIG. 9 is a schematic top view of a transparent display apparatus 100H according to some implementations of the present disclosure. At least one difference between the transparent display apparatus 100H drawn in FIG. 9 and the foregoing transparent display apparatus lies in that, in the transparent display apparatus 100H drawn in FIG. 9, the substrate 110 of the bi-directional optical module 101 may include a central area 114 and a peripheral area 116, and the peripheral area 116 is located on an edge of the substrate 110, and surrounds the central area 114. In addition, to make the figure simpler, FIG. 9 draws only some pixel units that are inside the central area 114 and the peripheral area 116. This should be clearly described in advance.

The central area 114 may have first-type pixel units P1 that are repetitively arranged. The first-type pixel unit P1 may be jointly formed by four first LEDs 120, one second LED 130, and one light-transparent portion T'. The peripheral area 116 may have second-type pixel units P2 that are repetitively arranged. The second-type pixel unit P2 may be jointly formed by three first LEDs 120, three second LEDs 130, and three light-transparent portions T'. In addition, a quantity of second LEDs 130 of the first-type pixel unit P1 may be different from a quantity of second LEDs 130 of the second-type pixel unit P2, so that the transparent display apparatus 100H may be designed according to different application scenarios or different requirements.

In the foregoing configuration, illumination brightness of the central area 114 may be different from illumination brightness of the peripheral area 116. This may be achieved by adjusting areas of second LEDs 130 of pixel units. For example, areas of second LEDs 130 of pixel units of the central area 114 may be designed to be less than areas of second LEDs 130 of pixel units of the peripheral area 116. Alternatively, driving currents of second LEDs 130 of pixel units may be adjusted. In some implementations, among proportions of areas of pixel units, a proportion of the areas of the second LEDs 130 of the pixel units of the central area 114 is less than a proportion of the areas of the second LEDs 130 of the pixel units of the peripheral area 116.

Specifically, by means of the foregoing configuration, the illumination brightness of the central area 114 may be designed to be less than the illumination brightness of the peripheral area 116, helping satisfy a scenario of presenting a to-be-displayed article in the peripheral area 116. In addition, a size of a light-transparent area T of the first-type pixel unit P1 may also be different from a size of a second LED 130 of the second-type pixel unit P2, so that the transparent display apparatus 100H may be further designed according to different application scenarios or different requirements. On the other hand, when the first-type pixel unit P1 of the central area 114 is configured in a manner of staggered arrangement (for example, the arrangement manner in FIG. 7 or FIG. 8), the central area 114 may have a relatively high resolution.

In addition, illumination intensity of the pixel units in the central area 114 may be different due to different configurations that are used. For example, in the central area 114, in addition to the first-type pixel units P1 that are repetitively arranged, there may further be first-type pixel units P1' that are repetitively arranged. Compared with the first-type pixel unit P1', the first-type pixel unit P1 is closer to a middle position of the central area. That is, the first-type pixel unit P1' may be located between the first-type pixel unit P1 and the second-type pixel unit P2. At least one difference between the first-type pixel unit P1 and the first-type pixel unit P1' lies in that, an area of second LEDs 130' of the first-type pixel unit P1 is smaller than an area of second LEDs 130' of the first-type pixel unit P1'. By means of this configuration, display effects and transparency that are of the bi-directional optical module 101 and that are at a position close to a middle position of the central area 114 can be improved, and a lighting effect at a position that is away from the middle position of the central area 114 is also improved.

Figure 10A:
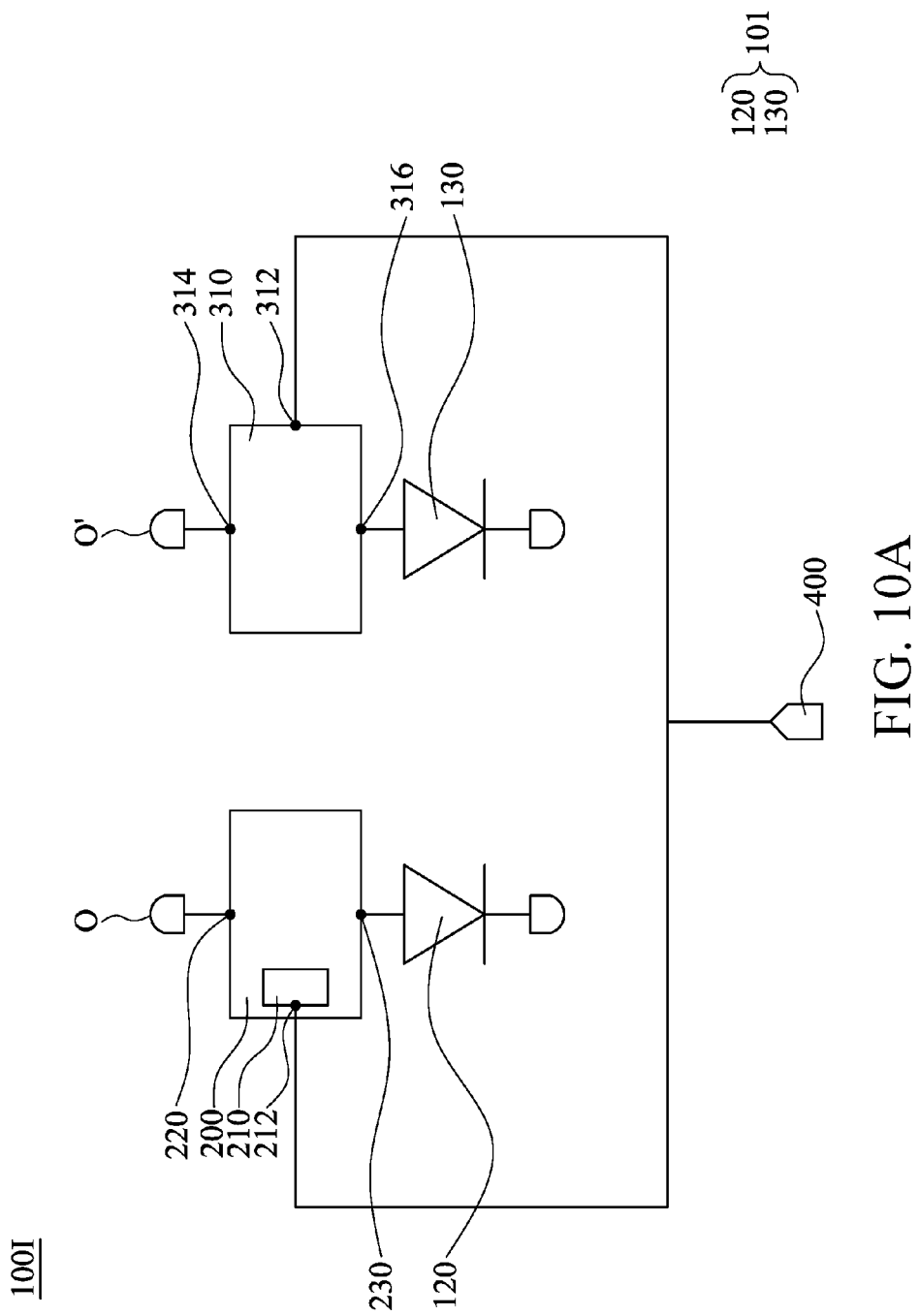
FIG. 10A is a schematic configuration diagram of a local circuit of a transparent display apparatus according to some implementations of the present disclosure.

Referring to FIG. 10A, FIG. 10A is a schematic top view of a local circuit of a transparent display apparatus 100I according to some implementations of the present disclosure. The local circuit of the transparent display apparatus 100I includes the first LED 120 and the second LED 130 that are of the bi-directional optical module 101, a pixel circuit 200, a second switch transistor 310, a control signal source 400, and voltage supply sources O and O'.

The pixel circuit 200 is electrically coupled to the first LED 120. The pixel circuit 200 includes a first switch transistor 210, and the first switch transistor 210 has a first gate electrode 212. The first gate electrode 212 may be used as a signal control end of the pixel circuit 200, and is electrically coupled to the control signal source 400. Therefore, the pixel circuit 200 may be configured to drive and control the first LED 120. That is, the pixel circuit 200 can drive and control a display area of the transparent display apparatus 100I.

The second switch transistor 310 is electrically coupled to the second LED 130. The second switch transistor 310 has a second gate electrode 312. The second gate electrode 312 may be used as a signal control end of the second switch transistor 310, and is electrically coupled to the control signal source 400. Therefore, the second switch transistor 310 may be configured to drive and control the second LED 130. That is, the second switch transistor 310 can drive and control a lighting area of the transparent display apparatus 100I.

The signal control end of the pixel circuit 200 and the signal control end of the second switch transistor 310 may share the control signal source 400. That is, the control signal source 400 may provide a control signal to the display area and the lighting area of the transparent display apparatus 100I, thereby simplifying circuit configuration of the transparent display apparatus 100I. In some implementations, the control signal source 400 may be a light emission signal driver or a scanning signal driver. However, the present disclosure is not limited to this.

In addition, the pixel circuit 200 may further include circuit junctions 220 and 230. The circuit junction 220 of the pixel circuit 200 may be electrically coupled to the independent voltage supply source O, and the other circuit junction 230 of the pixel circuit 200 may be electrically coupled to the first LED 120. The voltage supply source O may be a high potential voltage supply source or a low potential voltage supply source. That is, at least one circuit junction (for example, the circuit junction 220) of the pixel circuit 200 may not share a voltage supply source with the second switch transistor 310.

Similarly, the second switch transistor 310 may further include electrodes 314 and 316. The electrode 314 of the second switch transistor 310 may be electrically coupled to the independent voltage supply source O', and the other electrode 316 of the second switch transistor 310 may be electrically coupled to the second LED 130. The voltage supply source O' may be a high potential voltage supply source or a low potential voltage supply source. That is, at least one electrode (for example, the electrode 314) of the second switch transistor 310 may not share a same voltage supply source with another circuit.

By means of this configuration, when the electrodes 314 and 316 of the second switch transistor 310 are respectively electrically coupled to the voltage supply source O' and the second LED 130, the second switch transistor 310 may be disposed on a side of the display area of the transparent display apparatus 100I, and does not occupy extra space inside the display area. For example, the second switch transistor 310 may be disposed in a wiring area that is of the transparent display apparatus 100I and that is close to an edge, and does not overlap a position of a pixel unit in the display area. Compared with the peripheral area, a specific position of the wiring area may be farther away from the central area (for example, the peripheral area and the central area in FIG. 9), that is, the peripheral area may be located between the central area and the wiring area.

Figure 10B:
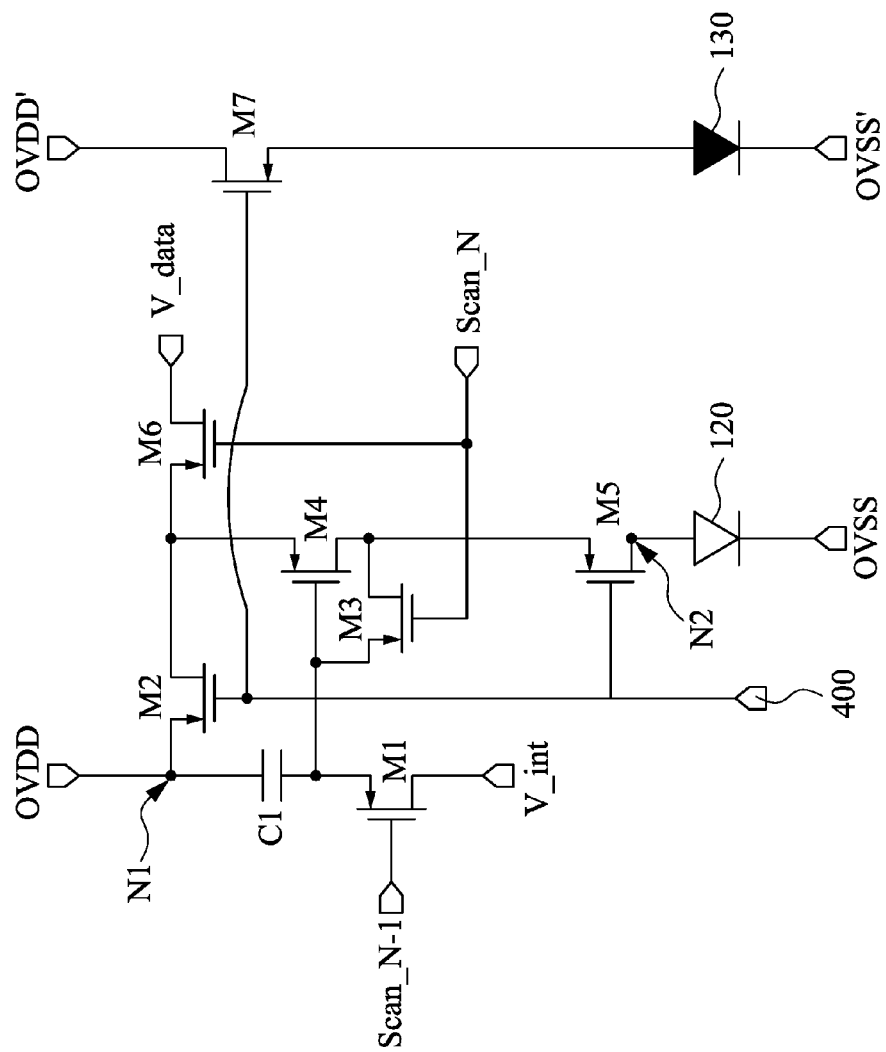
FIG. 10B is an equivalent circuit diagram of the local circuit of FIG. 10A according to some implementations of the present disclosure.

For example, a specific equivalent circuit diagram of the local circuit may be shown in FIG. 10B. FIG. 10B is an equivalent circuit diagram of the local circuit of FIG. 10A according to some implementations of the present disclosure. In FIG. 10B, the drawn circuit diagram includes high potential voltage supply sources OVDD and OVDD', low potential voltage supply sources OVSS and OVSS', the first LED 120, the second LED 130, transistors M1 to M7, a capacitor C1, an input sources V_int and V_data, shift signal sources SCAN_N−1 and SCAN_N, and the control signal source 400.

The high potential voltage supply sources OVDD and OVDD' in FIG. 10B correspond to the voltage supply sources O and O' in FIG. 10A. The first LED 120 and the second LED 130 in FIG. 10B respectively correspond to the first LED 120 and the second LED 130 in FIG. 10A. The transistors M5 and M7 in FIG. 10B respectively correspond to the first switch transistor 210 and the second switch transistor 310 in FIG. 10A. The control signal source 400 in FIG. 10B corresponds to the control signal source 400 in FIG. 10A. In addition, circuit junctions N1 and N2 in FIG. 10B respectively correspond to the circuit junctions 220 and 230 in FIG. 10A.

As shown in FIG. 10B, the transistors M5 and M7 may be respectively used as switch components of the first LED 120 and the second LED 130, and are jointly connected to the control signal source 400, that is, the transistors M5 and M7 share the control signal source 400.

Figure 11:
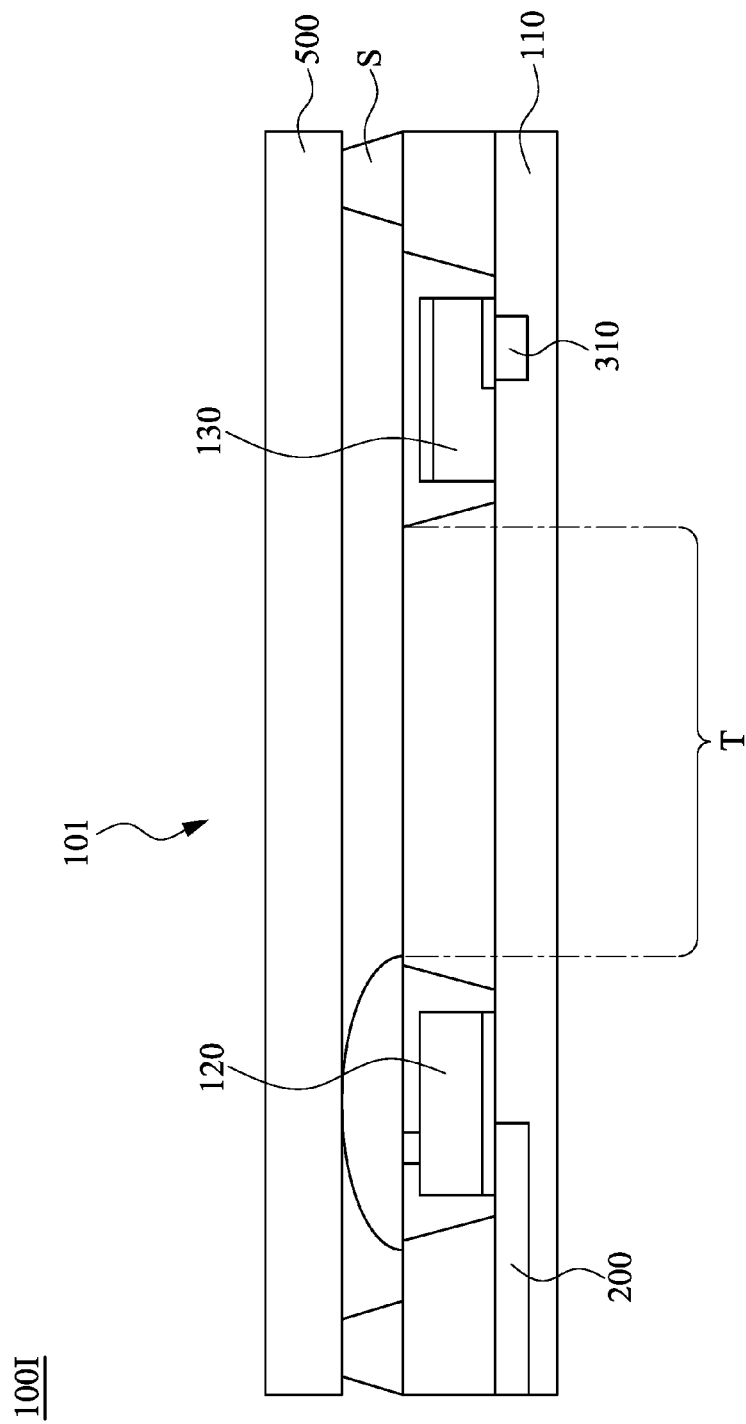
FIG. 11 is a schematic sectional view of a structure that is obtained by configuring the circuit of the transparent display apparatus of FIG. 10A.

In addition, the pixel circuit 200 and the second switch transistor 310 may be configured in a manner of being respectively adjacent to the first LED 120 and the second LED 130. For example, referring to FIG. 11, FIG. 11 is a schematic sectional view of a structure that is obtained by configuring the circuit of the transparent display apparatus 100I of FIG. 10A. A location of the cross-section drawn in FIG. 11 is the same as that in FIG. 2.

In FIG. 11, the pixel circuit 200 and the second switch transistor 310 are disposed on the substrate 110 of the bi-directional optical module 101. The pixel circuit 200 and the second switch transistor 310 are respectively connected to the first LED 120 and the second LED 130.

The pixel circuit 200 is located below the first LED 120. A perpendicular projection of the pixel circuit 200 onto the substrate 110 of the bi-directional optical module 101 is separated from the light-transparent area T of the bi-directional optical module 101. That is, the pixel circuit 200 is not located just below the light-transparent area T of the bi-directional optical module 101. Therefore, the pixel circuit 200 does not affect penetration of the light-transparent area T of the bi-directional optical module 101, helping increase penetration of the transparent display apparatus 100I. In addition, the bi-directional optical module 101 may simultaneously provide a light source to a display picture of the transparent display apparatus 100I and provide a light source to a to-be-displayed article that is behind the transparent display apparatus 100I, helping improve viewing quality of the displayed article that is behind the transparent display apparatus 100I.

In addition, the transparent display apparatus 100I may include a cover plate 500 and a spacer S. The cover plate 500 is disposed opposite to the substrate 110, and the spacer S is disposed between the substrate 110 and the cover plate 500, so that the substrate 110 and the cover plate 500 may be separated and spaced apart from each other by at least a distance. In some implementations, the cover plate 500 may be a transparent substrate, a rigid substrate, or a flexible substrate, such as glass, tempered glass, PC, PET, or another cyclic olefin copolymer. However, the present disclosure is not limited to this. In some implementations, the spacer S may be a granular spacer or an optical spacer. However, the present disclosure is not limited to this.

Figure 12A:
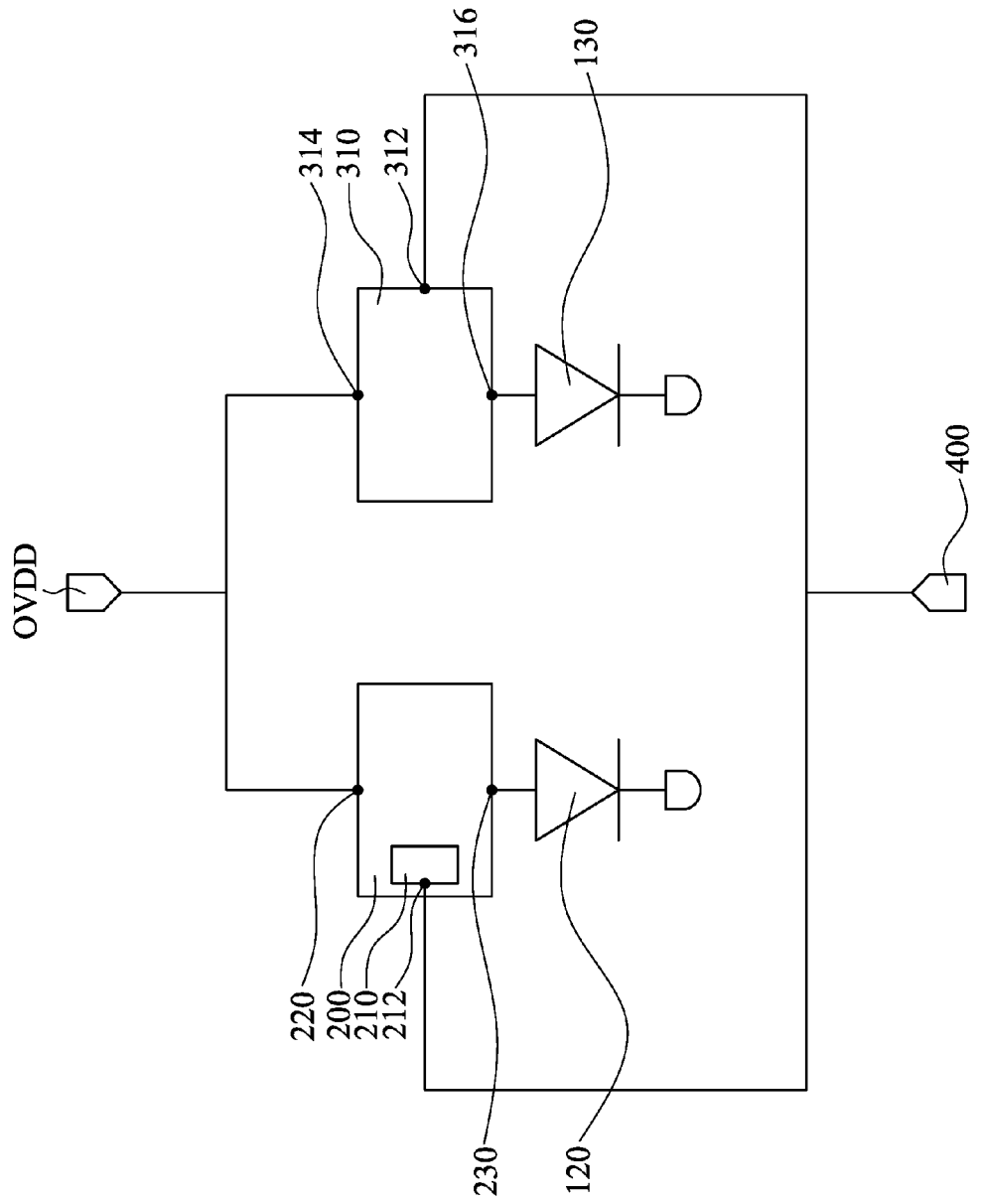
FIG. 12A is a schematic configuration diagram of a local circuit of a transparent display apparatus according to some implementations of the present disclosure.

Referring to FIG. 12A, FIG. 12A is a schematic configuration diagram of a local circuit of a transparent display apparatus 100J according to some implementations of the present disclosure. At least one difference between the local circuit that is of the transparent display apparatus 100J and that is drawn in FIG. 12A and the local circuit that is of the transparent display apparatus 100I and that is drawn in FIG. 10A lies in that, in the local circuit that is of the transparent display apparatus 100J and that is drawn in FIG. 12A, an electrode 314 of the second switch transistor 310 and the circuit junction 220 of the pixel circuit 200 are electrically coupled to the same high potential voltage supply source OVDD. Other details in this implementation are roughly described above, and are not described herein again.

Figure 12B:
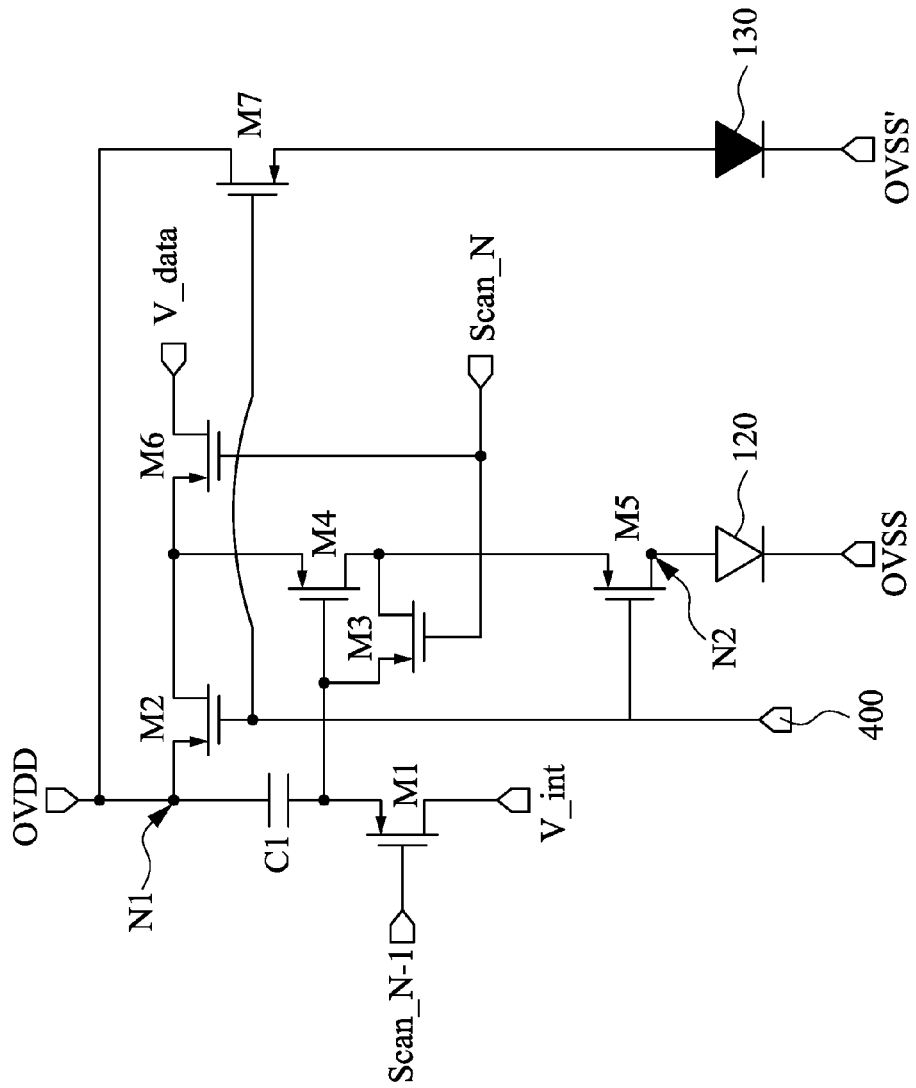
FIG. 12B is an equivalent circuit diagram of the local circuit of FIG. 12A according to some implementations of the present disclosure.

In addition, for example, a specific equivalent circuit diagram of the local circuit described in this implementation may be shown in FIG. 12B. FIG. 12B is an equivalent circuit diagram of the local circuit of FIG. 12A according to some implementations of the present disclosure. At least one difference between the equivalent circuit diagram of the local circuit in FIG. 12B and the equivalent circuit diagram of the local circuit in FIG. 10B lies in that, in the equivalent circuit diagram of the local circuit in FIG. 12B, the high potential voltage supply source OVDD' is omitted, and the transistor M7 is electrically coupled to the high potential voltage supply source OVDD.

Figure 13:
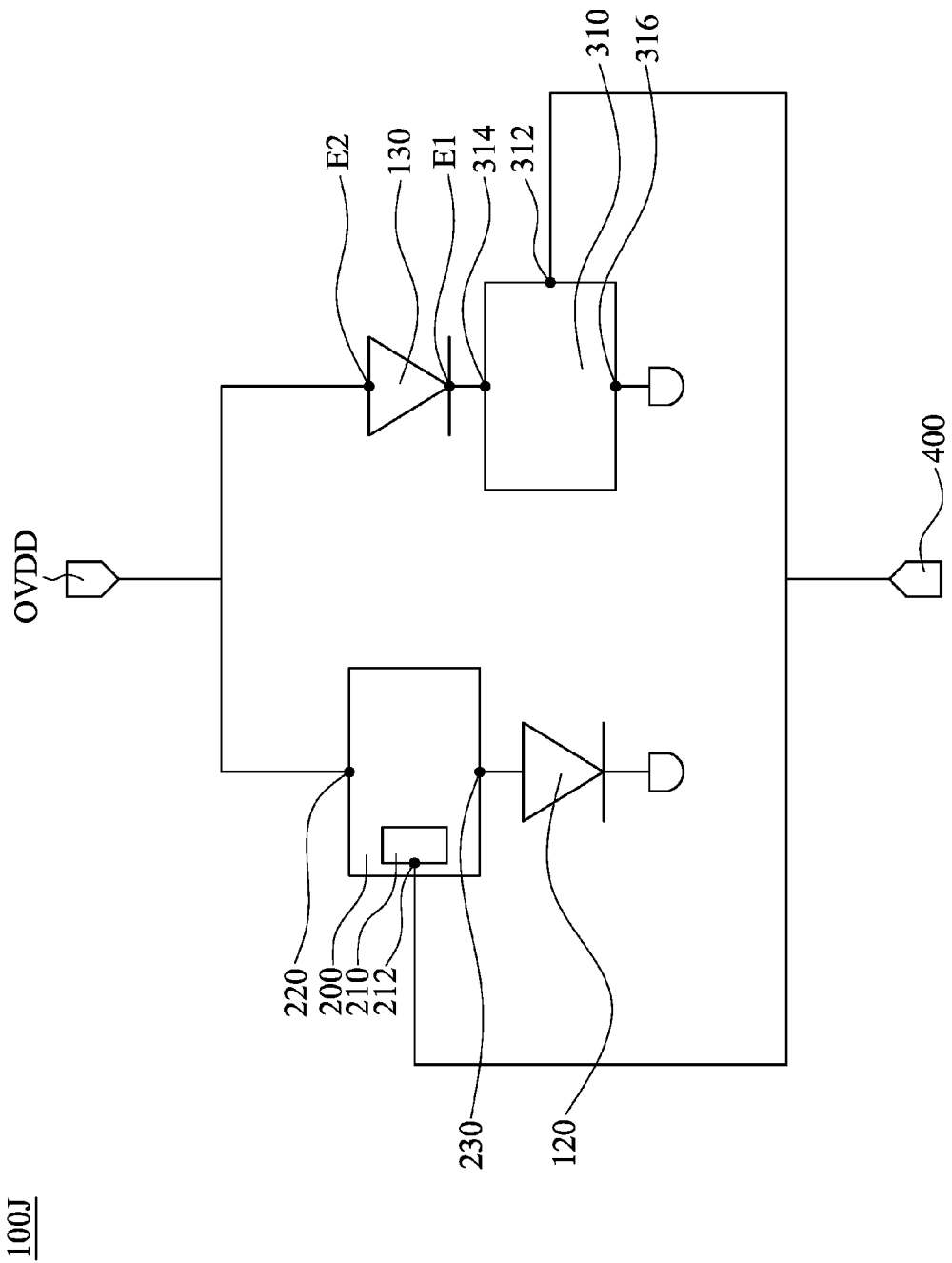
FIG. 13 is a schematic configuration diagram of a local circuit of a transparent display apparatus according to some implementations of the present disclosure.

Referring to FIG. 13, FIG. 13 is a schematic configuration diagram of a local circuit of a transparent display apparatus 100K according to some implementations of the present disclosure. At least one difference between the local circuit that is of the transparent display apparatus 100K and that is drawn in FIG. 13 and the local circuit that is of the transparent display apparatus 100J and that is drawn in FIG. 12A lies in that, in the local circuit that is of the transparent display apparatus 100K and that is drawn in FIG. 13, the second LED 130 may include electrodes E1 and E2, and the electrodes E1 and E2 are respectively electrically coupled to the second switch transistor 310 and the high potential voltage supply source OVDD. In addition, the circuit junction 220 of the pixel circuit 200 is also electrically coupled to the high potential voltage supply source OVDD. That is, the second LED 130 is coupled between the high potential voltage supply source OVDD and the second switch transistor 310, and the high potential voltage supply source OVDD may be electrically connected to the second switch transistor 310 by using the second LED 130.

By means of this configuration, the pixel circuit 200 and the second switch transistor 310 may share the high potential voltage supply source OVDD. Therefore, one fewer high potential voltage supply source OVDD may be disposed for the transparent display apparatus 100K, helping reduce manufacturing costs of the transparent display apparatus 100K. Other details in this implementation are roughly described above, and are not described herein again.

In addition, a specific equivalent circuit diagram of the local circuit described in this implementation may be achieved by selectively adjusting the equivalent circuit diagram drawn in FIG. 12B. For example, at least one difference between the equivalent circuit diagram in this implementation and the equivalent circuit diagram in FIG. 12B lies in that, the second LED 130 in this implementation is coupled between the high potential voltage supply source OVDD and the transistor M7.

Figure 14:
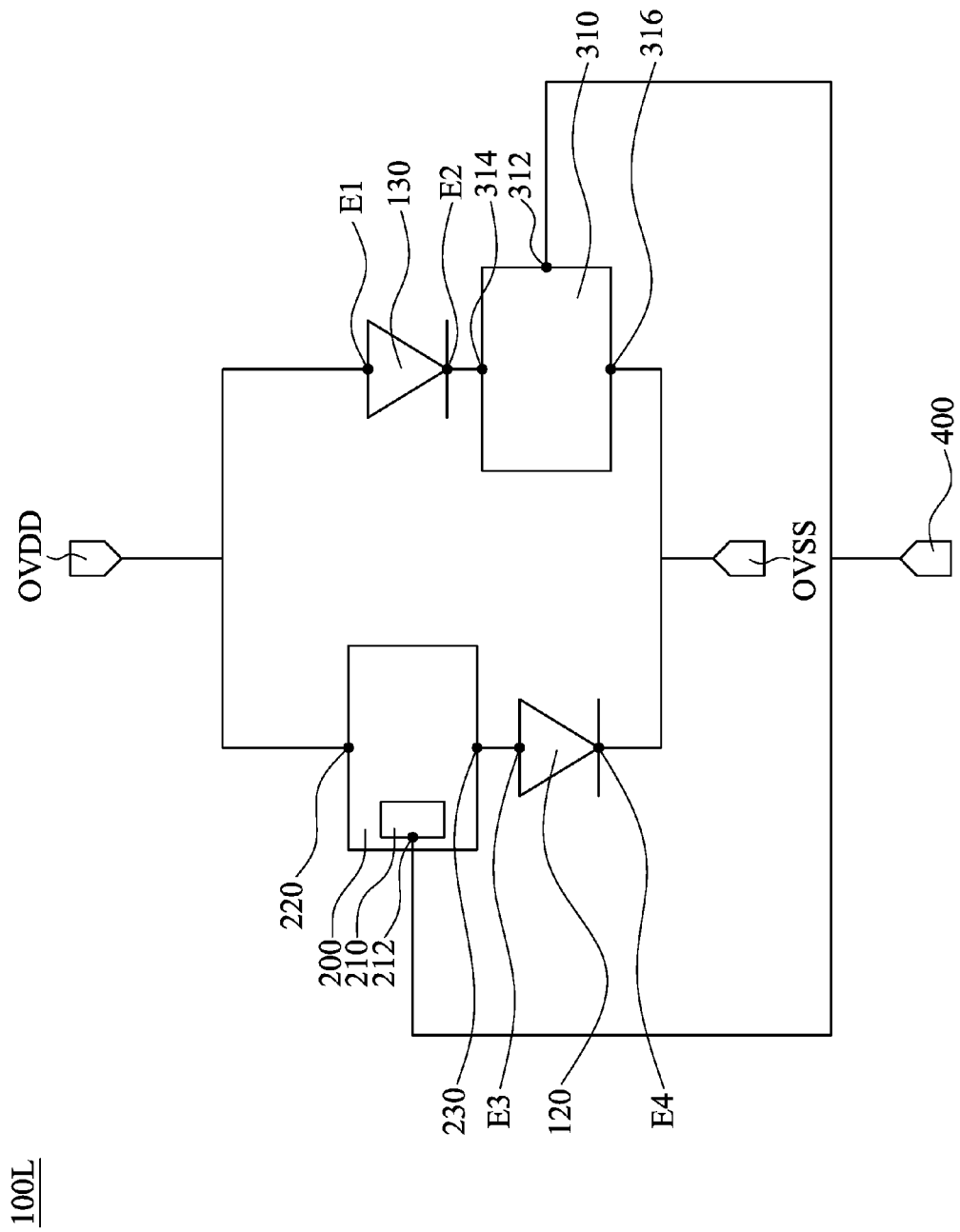
FIG. 14 is a schematic configuration diagram of a local circuit of a transparent display apparatus according to some implementations of the present disclosure.
Figure 15:
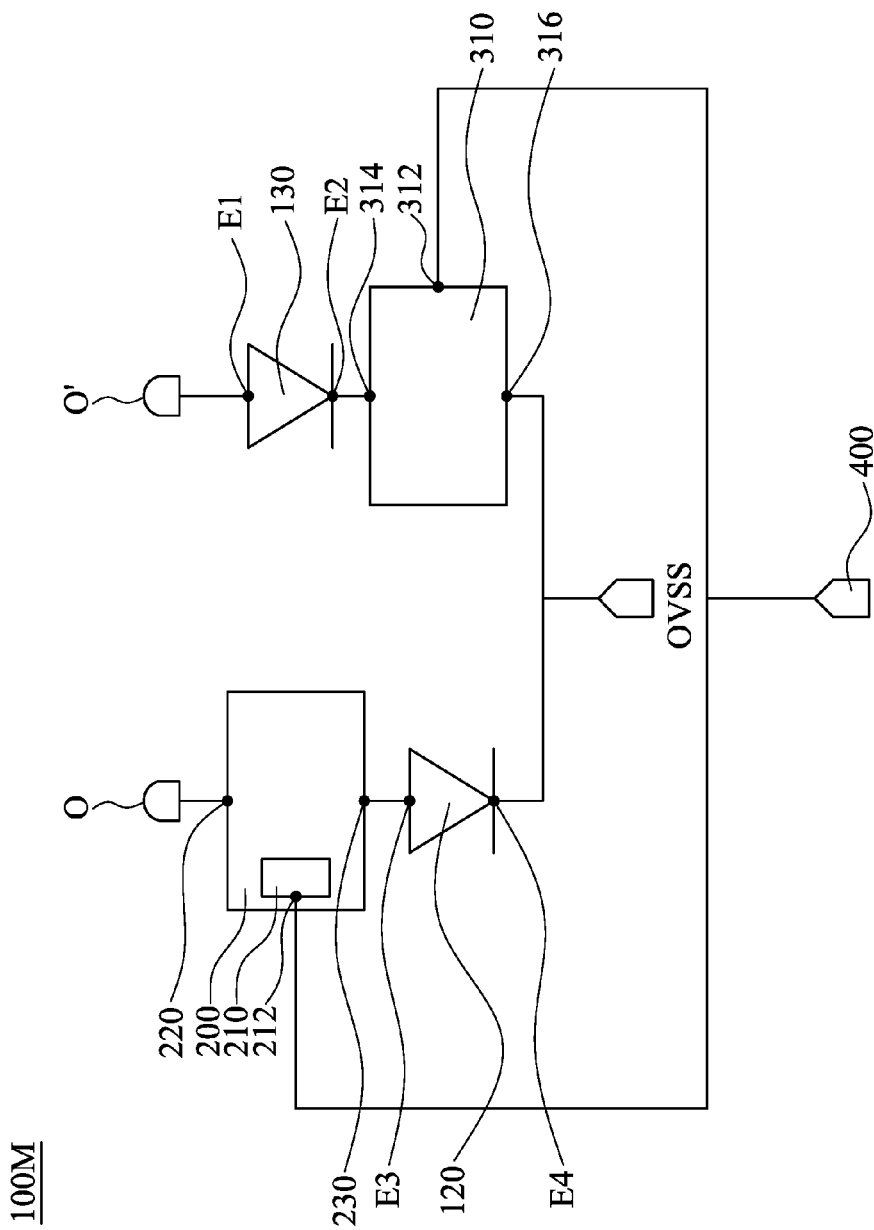
FIG. 15 is a schematic configuration diagram of a local circuit of a transparent display apparatus according to some implementations of the present disclosure.

Referring to FIG. 14 and FIG. 15, FIG. 14 and FIG. 15 are respectively schematic configuration diagrams of local circuits of transparent display apparatuses 100L and 100M according to some implementations of the present disclosure. At least one difference between the local circuits that are of the transparent display apparatuses 100L and 100M and that are drawn in FIG. 14 and FIG. 15 and the local circuit of the foregoing transparent display apparatus lies in that, in the local circuits that are of the transparent display apparatuses 100L and 100M and that are drawn in FIG. 14 and FIG. 15, the first LED 120 may include electrodes E3 and E4, and the electrodes E3 and E4 are respectively electrically coupled to the pixel circuit 200 and the low potential voltage supply source OVSS. In addition, the electrode 316 of the second switch transistor 310 is also electrically coupled to the low potential voltage supply source OVSS. By means of this configuration, the first LED 120 and the second switch transistor 310 may share the low potential voltage supply source OVSS, helping reduce manufacturing costs of the transparent display apparatus. Other details in this implementation are roughly described above, and are not described herein again.

In addition, a specific equivalent circuit diagram of the local circuit described in this implementation may be achieved by selectively adjusting the equivalent circuit diagram drawn in FIG. 10B or FIG. 12B. For example, at least one difference between the equivalent circuit diagram in this implementation and the foregoing equivalent circuit diagram lies in that, the first LED 120 and the second LED 130 in this implementation are electrically coupled to a same low potential voltage supply source (for example, the low potential voltage supply source OVSS or OVSS'), and the second LED 130 may be selectively coupled between the high potential voltage supply source OVDD and the transistor M7.

Figure 16:
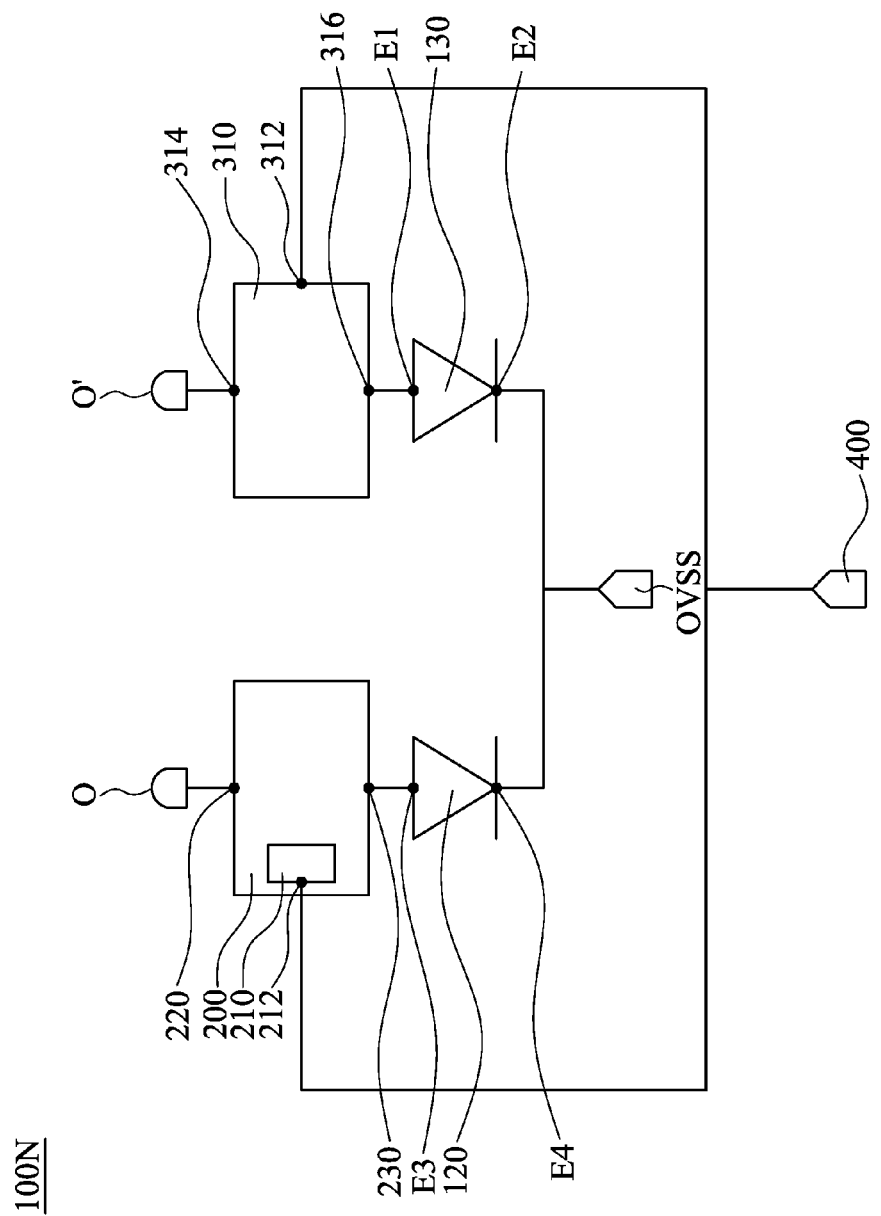
FIG. 16 is a schematic configuration diagram of a local circuit of a transparent display apparatus according to some implementations of the present disclosure.
Figure 17:
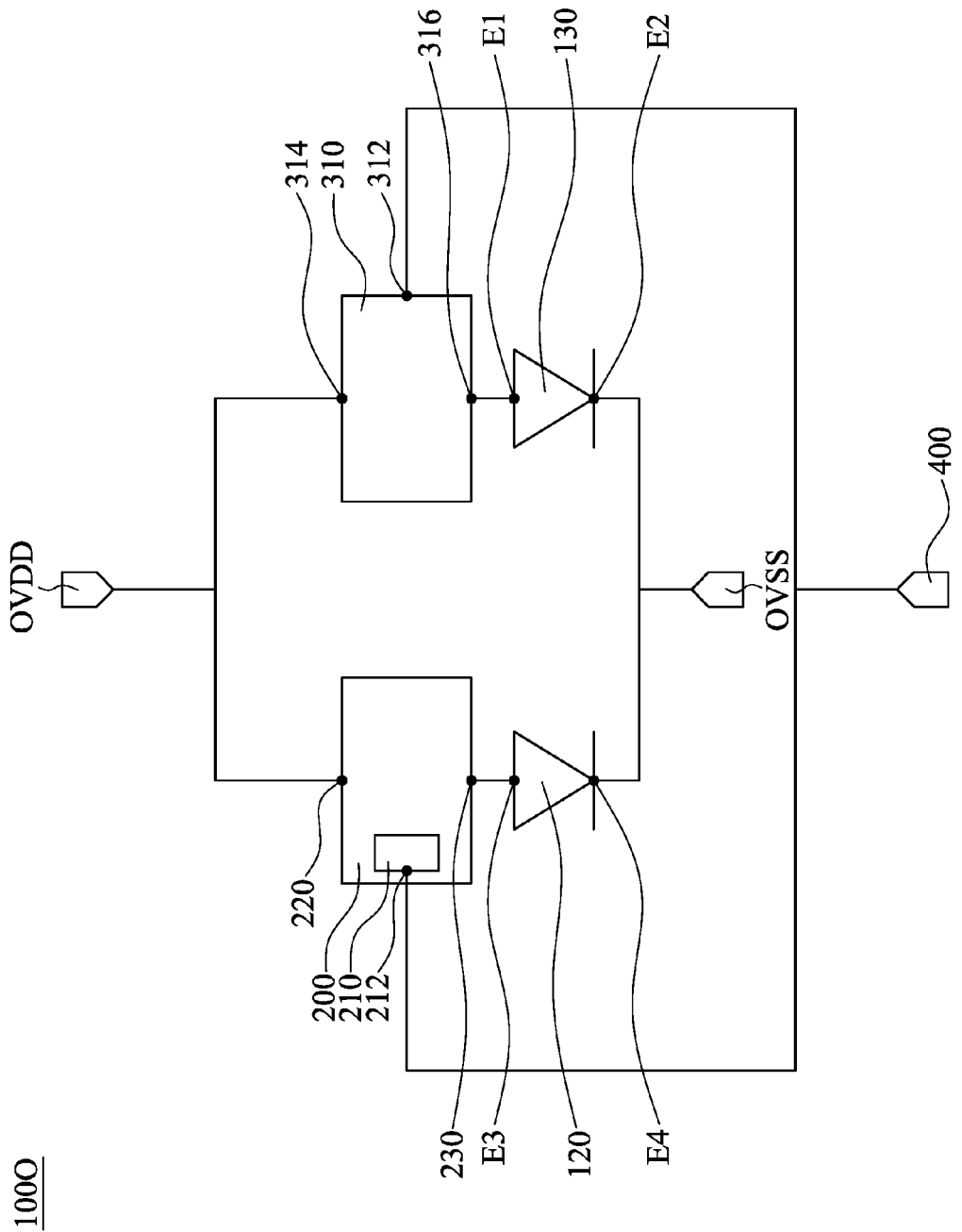
FIG. 17 is a schematic configuration diagram of a local circuit of a transparent display apparatus according to some implementations of the present disclosure.

Referring to both FIG. 16 and FIG. 17, FIG. 16 and FIG. 17 are respectively schematic configuration diagrams of local circuits of transparent display apparatuses 100N and 100O according to some implementations of the present disclosure. At least one difference between the local circuits that are of the transparent display apparatuses 100N and 100O and that are drawn in FIG. 16 and FIG. 17 and the local circuit of the foregoing transparent display apparatus lies in that, in the local circuits that are of the transparent display apparatuses 100N and 100O and that are drawn in FIG. 16 and FIG. 17, the electrodes E3 and E4 of the first LED 120 are respectively electrically coupled to the circuit junction 230 of the pixel circuit 200 and the low potential voltage supply source OVSS, and the electrodes E1 and E2 of the second LED 130 are respectively electrically coupled to the electrode 316 of the second switch transistor 310 and the low potential voltage supply source OVSS. By means of this configuration, the first LED 120 and the second LED 130 may share the low potential voltage supply source OVSS, helping reduce manufacturing costs of the transparent display apparatus 100. Other details in this implementation are roughly described above, and are not described herein again.

In addition, a specific equivalent circuit diagram of the local circuit described in this implementation may be achieved by selectively adjusting the equivalent circuit diagram drawn in FIG. 10B or FIG. 12B. For example, at least one difference between the equivalent circuit diagram in this implementation and the foregoing equivalent circuit diagram lies in that, the first LED 120 and the second LED 130 in this implementation are electrically coupled to a same low potential voltage supply source (for example, the low potential voltage supply source OVSS or OVSS').

In the foregoing multiple implementations, the bi-directional optical module has the first LED, the second LED, and the at least one light-transparent area. The first light-outlet surface of the first LED is away from the substrate relative to the first reflection surface. The second light-outlet surface of the second LED is close to the substrate relative to the second reflection surface. In this way, the first light beam emitted by the first LED and the second light beam emitted by the second LED may travel in directions that are opposite to each other, thereby implementing bi-directional light emission of the bi-directional optical module. In addition, the bi-directional optical module may simultaneously provide a light source to a display picture of the transparent display apparatus and provide a light source to a to-be-displayed article that is behind the transparent display apparatus, thereby helping improve viewing quality of the displayed article that is behind the transparent display apparatus.

Although the present disclosure has been described by using the foregoing implementations, is the implementations are not used to limit the present invention. A person skilled in the art can make various modifications and improvements without departing from the spirit and scope of the present disclosure. Therefore, the protection scope of the present disclosure should be subject to the scope defined by the appended claims.

What is claimed is:

1. A bi-directional optical module, comprising:
    a substrate;
    at least one first light-emitting diode (LED), configured to emit a first light beam and disposed on a surface of the substrate, wherein the first LED has a first reflection surface and a first light-outlet surface that are opposite to each other, the first light-outlet surface is away from the substrate relative to the first reflection surface, the first light beam travels along a first direction, and the first direction is a direction in which the first reflection surface and the first light-outlet surface are arranged; and
    at least one second LED, configured to emit a second light beam and disposed on the surface of the substrate, wherein the second LED has a second reflection surface and a second light-outlet surface that are opposite to each other, the second light-outlet surface is close to the substrate relative to the second reflection surface, the second light beam travels along a second direction, the second direction is a direction in which the second reflection surface and the second light-outlet surface are arranged, and the first direction and the second direction are a pair of directions opposite to each other, wherein the substrate has at least one light-transparent area that is not occupied by the first LED and the second LED; and a light guiding structure, disposed on the first light-outlet surface of the first LED, wherein the light guiding structure includes a plastic material and a micro-lens, the plastic material is disposed between the micro-lens and the first LED, and a refractive index of the plastic material is between a refractive index of the first LED and a refractive index of the air.

2. The bi-directional optical module according to claim 1, wherein the first LED comprises:

a first electrode structure, disposed on the first light-outlet surface of the first LED, wherein there is a first electrode contact area between the first electrode structure and the first light-outlet surface of the first LED; and a second electrode structure, disposed on the first light-outlet surface of the first LED, wherein there is a second electrode contact area between the second electrode structure and the first light-outlet surface of the first LED, wherein a sum of the first electrode contact area and the second electrode contact area is less than an area of the first light-outlet surface of the first LED.

3. The bi-directional optical module according to claim 1, wherein at least one of the second LEDs comprises:

a third electrode structure, disposed on the second reflection surface of the second LED, wherein there is a third electrode contact area between the third electrode structure and the second reflection surface of the second LED; and a fourth electrode structure, disposed on the second reflection surface of the second LED, wherein there is a fourth electrode contact area between the fourth electrode structure and the second reflection surface of the second LED, wherein a sum of the third electrode contact area and the fourth electrode contact area is essentially equal to an area of the second reflection surface of the second LED.

4. The bi-directional optical module according to claim 1, wherein the at least one first LED is arranged in a row in a direction, the at least one second LED is arranged in another row in the direction, the row of the at least one first LED and the row of the at least one second LED is arranged side by side, and are separated by the light-transparent area.

5. The bi-directional optical module according to claim 1, wherein the at least one first LED is arranged in a first row in a direction, the at least one second LED and the at least one light-transparent area is arranged in a second row in the direction in a staggered manner, and the first row and the second row are arranged side by side.

6. The bi-directional optical module according to claim 1, wherein the at least one second LED, the at least one first LED and may be classified into at least one red LED, at least one green first LED, and at least one blue first LED, wherein one of the second LEDs, one of the red LEDs, one of the green first LEDs, and one of the blue first LEDs are arranged in a direction and jointly form a unit, and a plurality of the units are repetitively arranged in the direction.

7. The bi-directional optical module according to claim 1, wherein the at least one first LED, the at least one second LED, and the at least one light-transparent area, wherein the at least one first LED, the at least one second LEDs, and the at least one light-transparent areas are arranged in a staggered manner.

8. The bi-directional optical module according to claim 1, wherein at least three of the first LEDs, at least one of the second LEDs, and at least one of the light-transparent areas jointly form a first-type pixel unit, and a plurality of the first-type pixel units are repetitively arranged in a central area of the substrate, wherein at least three of the first LEDs, at least one of the second LEDs, and at least one of the light-transparent areas jointly form a second-type pixel unit, and a plurality of the second-type pixel units are repetitively arranged in a peripheral area of the substrate, wherein a quantity of the second LEDs of the first-type pixel unit is different from a quantity of the second LEDs of the second-type pixel unit.

9. The bi-directional optical module according to claim 1, wherein at least three of the first LEDs, at least one of the second LEDs, and at least one of the light-transparent areas jointly form a first-type pixel unit, and a plurality of the first-type pixel units are repetitively arranged in a central area of the substrate, wherein at least three of the first LEDs, at least one of the second LEDs, and at least one of the light-transparent areas jointly form a second-type pixel unit, and a plurality of the second-type pixel units are repetitively arranged in a peripheral area of the substrate, wherein a size of the light-transparent area of the first-type pixel unit is different from a size of the light-transparent area of the second-type pixel unit.

10. A transparent display apparatus, comprising:
the bi-directional optical module according to claim 1; and
at least one pixel circuit, electrically coupled to the first light-emitting diode (LED) of the bi-directional optical module, wherein the pixel circuit comprises:
a first switch transistor, wherein the first switch transistor has a first gate electrode; and
at least one second switch transistor, electrically coupled to the second LED of the bi-directional optical module, wherein the second switch transistor comprises a second gate electrode, and the second gate electrode of the second switch transistor and the first gate electrode of the first switch transistor are electrically coupled to a same control signal source.

11. The transparent display apparatus according to claim 10, wherein a perpendicular projection of the pixel circuit onto the substrate of the bi-directional optical module is separated from the light-transparent area of the bi-directional optical module.

12. The transparent display apparatus according to claim 10, wherein the pixel circuit comprises a circuit junction, the circuit junction is electrically coupled to a high potential voltage supply source, and two electrodes of the second LED of the bi-directional optical module are respectively electrically coupled to the second switch transistor and the high potential voltage supply source.

13. The transparent display apparatus according to claim 10, wherein the second switch transistor of the bi-directional optical module comprises an electrode, the electrode is electrically coupled to a low potential voltage supply source, and two electrodes of the first LED of the bi-directional optical module are respectively electrically coupled to the pixel circuit and the low potential voltage supply source.

14. The transparent display apparatus according to claim 10, wherein two electrodes of the first LED of the bi-directional optical module are respectively electrically coupled to the pixel circuit and a low potential voltage supply source, and two electrodes of the second LED of the bi-directional optical module are respectively electrically coupled to the second switch transistor and the low potential voltage supply source.

15. The transparent display apparatus according to claim 10, wherein the substrate of the bi-directional optical module is made of glass, tempered glass, polycarbonate (PC), polyethylene terephthalate (PET), or other cyclic olefin copolymer, and the first LED and the second LED of the bi-directional optical module are respectively in direct contact with the surface of the substrate.

16. The bi-directional optical module according to claim 1, wherein the substrate is made of glass, tempered glass, polycarbonate (PC), polyethylene terephthalate (PET), or other cyclic olefin copolymer, and the first LED and the second LED are respectively in direct contact with the surface of the substrate.

* * * * *